United States Patent
Duan et al.

(10) Patent No.: US 7,382,017 B2
(45) Date of Patent: Jun. 3, 2008

(54) NANO-ENABLED MEMORY DEVICES AND ANISOTROPIC CHARGE CARRYING ARRAYS

(75) Inventors: Xiangfeng Duan, Mountain View, CA (US); Calvin Y. H. Cho, Portola Valley, CA (US); David L. Heald, Solvang, CA (US); Chunming Niu, Palo Alto, CA (US); J. Wallace Parce, Palo Alto, CA (US); David P. Stumbo, Belmont, CA (US)

(73) Assignee: Nanosys, Inc, Palo Alto, CA (US)

( * ) Notice: Subject to any disclaimer, the term of this patent is extended or adjusted under 35 U.S.C. 154(b) by 0 days.

(21) Appl. No.: 11/695,728

(22) Filed: Apr. 3, 2007

(65) Prior Publication Data

US 2007/0187768 A1   Aug. 16, 2007

Related U.S. Application Data

(60) Division of application No. 11/018,572, filed on Dec. 21, 2004, which is a continuation-in-part of application No. 10/962,972, filed on Oct. 12, 2004, now abandoned, which is a continuation-in-part of application No. 10/796,413, filed on Mar. 10, 2004, now abandoned.

(51) Int. Cl.
 *H01L 29/788* (2006.01)
(52) U.S. Cl. .................. 257/321; 257/17; 257/E27.085; 977/774; 977/785; 977/936
(58) Field of Classification Search ...................... None
See application file for complete search history.

(56) References Cited

U.S. PATENT DOCUMENTS

| | | |
|---|---|---|
| 5,043,940 A | 8/1991 | Harari |
| 5,434,825 A | 7/1995 | Harari |
| 5,714,766 A | 2/1998 | Chen et al. |
| 5,937,295 A | 8/1999 | Chen et al. |

(Continued)

FOREIGN PATENT DOCUMENTS

WO   WO-0103208   1/2001

(Continued)

OTHER PUBLICATIONS

Atwater, H.A. "Silicon nanoparticle engineering for novel logic and memory applications" Project Overview, Functional Nanostructures Program, NSF (Jan. 2001).

(Continued)

*Primary Examiner*—Jerome Jackson, Jr.
(74) *Attorney, Agent, or Firm*—Andrew L. Filler

(57) ABSTRACT

Methods and apparatuses for nanoenabled memory devices and anisotropic charge carrying arrays are described. In an aspect, a memory device includes a substrate, a source region of the substrate, and a drain region of the substrate. A population of nanoelements is deposited on the substrate above a channel region, the population of nanolements in one embodiment including metal quantum dots. A tunnel dielectric layer is formed on the substrate overlying the channel region, and a metal migration barrier layer is deposited over the dielectric layer. A gate contact is formed over the thin film of nanoelements. The nanoelements allow for reduced lateral charge transfer. The memory device may be a single or multistate memory device. In a multistate memory device which comprises one or more quantum dots or molecules having a plurality of discrete energy levels, a method is disclosed for charging and/or discharging the device which comprises filling each of the plurality of discrete energy levels of each dot or molecule with one or more electrons, and subsequently removing individual electrons at a time from each discrete energy level of the one or more dots or molecules.

5 Claims, 24 Drawing Sheets

U.S. PATENT DOCUMENTS

| | | | |
|---|---|---|---|
| 5,959,896 | A | 9/1999 | Forbes |
| 6,054,349 | A | 4/2000 | Nakajima et al. |
| 6,090,666 | A | 7/2000 | Ueda et al. |
| 6,139,626 | A | 10/2000 | Norris et al. |
| 6,159,620 | A | 12/2000 | Heath et al. |
| 6,207,229 | B1 | 3/2001 | Bawendi et al. |
| 6,222,762 | B1 | 4/2001 | Guterman et al. |
| 6,232,643 | B1 | 5/2001 | Forbes et al. |
| 6,275,419 | B1 | 8/2001 | Guterman et al. |
| 6,297,095 | B1 | 10/2001 | Muralidhar et al. |
| 6,317,363 | B1 | 11/2001 | Guterman et al. |
| 6,317,364 | B1 | 11/2001 | Guterman et al. |
| 6,322,901 | B1 | 11/2001 | Bawendi et al. |
| 6,333,214 | B1 | 12/2001 | Kim et al. |
| 6,344,403 | B1 | 2/2002 | Madhukar et al. |
| 6,413,819 | B1 | 7/2002 | Zafar et al. |
| 6,441,392 | B1 | 8/2002 | Gautier et al. |
| 6,576,291 | B2 | 6/2003 | Bawendi et al. |
| 6,577,532 | B1 | 6/2003 | Chevallier |
| 6,586,785 | B2 | 7/2003 | Flagan et al. |
| 6,645,444 | B2 * | 11/2003 | Goldstein ............ 423/1 |
| 6,656,792 | B2 | 12/2003 | Choi et al. |
| 6,657,253 | B2 | 12/2003 | Kim et al. |
| 6,670,670 | B2 | 12/2003 | Chae et al. |
| 6,723,606 | B2 | 4/2004 | Flagan et al. |
| 6,730,537 | B2 | 5/2004 | Hutchison et al. |
| 6,756,292 | B2 * | 6/2004 | Lee et al. ............ 438/591 |
| 6,872,645 | B2 | 3/2005 | Duan et al. |
| 6,888,739 | B2 | 5/2005 | Forbes |
| 6,949,793 | B2 | 9/2005 | Choi et al. |
| 6,951,782 | B2 | 10/2005 | Ding |
| 7,005,697 | B2 * | 2/2006 | Batra et al. ............ 257/315 |
| 7,045,851 | B2 | 5/2006 | Black et al. |
| 2003/0077625 | A1 | 4/2003 | Hutchinson |
| 2003/0153151 | A1 | 8/2003 | Choi et al. |
| 2004/0074565 | A1 | 4/2004 | Hayakawa et al. |
| 2004/0130941 | A1 | 7/2004 | Kan et al. |
| 2004/0144972 | A1 | 7/2004 | Dai et al. |
| 2005/0072989 | A1 | 4/2005 | Bawendi et al. |
| 2006/0175653 | A1 | 8/2006 | Joo et al. |
| 2006/0231889 | A1 | 10/2006 | Chen et al. |

FOREIGN PATENT DOCUMENTS

| | | |
|---|---|---|
| WO | WO-0217362 | 2/2002 |
| WO | WO-0248701 | 6/2002 |
| WO | WO-2005017962 | 2/2005 |
| WO | WO-2006112793 | 10/2006 |

OTHER PUBLICATIONS

Bell, L.D. et al., "A Radiation-tolerant, low-power non-volatile memory based on silicon nanocrystal quantum dots" Innovative Approaches to Outer Planetary Exploration 2001-2020, publication date unknown.

Bodefield, M.C. et al., "Storage of electrons and holes in self-assumbled InAs quantum dots" *Appl. Phys. Lett.* (1999) 74(13):1839-1841.

Casperson, J.D. et al., "Materials issues for layered tunnel barrier structures" J. Appl. Phys. (2002) 92(1):261-267.

Chae, D-H et al., "Nanocrystal memory cell using high-density SiGe Quantam Dot Array" J Kor. Phys. Soc. (1999) 35:S995-S998.

Corso, D. et al., "Localized Charge storage in nanocrystal memories: feasibility of a multi-bit cell", publication and publication date unknown.

De Blauwe, J. "Nanoparticle Nonvolatile Memory Devices," IEEE Trans. Nanotechnology (2002) 1:72.

Drexler, H. et al., "Spectroscopy of quantum levels in charge-tunable InGaAs quantum dots" Phys. Ref. Lett (1994) 73:2252-2255.

Iannaccone, G. et al., "Simulation of a quantum-dot flash memory," *J. Appl. Phys.* (1998) 84(9):5032-5036.

Kan, E. "Technology for self-assembled entities in logic and memory units below the lithography limit" Cornell Nanoscale Facility, publication date unknown.

Kolloipoulou, S. et al., "Hybrid silicon-organic nanoparticle memory device" J. Appl. Phys. (2003) 94(8):5234-5239.

Lin, Y-H et al., "High-Performance Nonvaolatile HfO2 Nanocrystal Memory" *IEEE Electron Device Letts* (Mar. 2005) 26(3):154-156.

Mandal, S. "Quantum Dots," E & ECE, IIT Kharagpur, Roll:9819107, 24 pages, Aug. 29, 2001.

McCarthy, W., O'Reilly Network, "Quantum Dots and Programmable Matter" (visited Jan. 12, 2004) http://www.oreillynet.com/pub/a/network/2004/01/09/quantumdots.html, 5 pages, Copyright 2000-2004 O'Reilley & Associates, Inc.

Silicon Storage Technology, Inc. "Technical Comparison of Floating Gate Reprogrammable Nonvolatile Memories" *Technical Paper*, Nov. 2001 (Copyright 2002), 8 pages.

Takata, M. et al. "Fundamental characteristics of new non-volatile memory with extremely high density metal quantum dots", publication and publication date unknown.

Tiwari, S. et al., "Volatile and Non-Volatile Memories in Silicon with Nano-Crystal Storage," IEDM (1995) 95-521.

Tiwari, S. et al., "A silicon nanocrystals based memory" Appl. Phys. Lett (1996) 68(10:1377-1379.

Vampola, K. et al., "Growth and Characterization of metal nanocrystals" Cornell Nanofabrication Facility, publication date unknown.

"ISSCC delegates eye successor to floating gate flash memory" http://www.electronicsweekly.com/article4907.htm Feb. 25, 2004.

Takata, M. et al. "New non-volatile memory with extremely high density metal nano-dots" IEDM (2003) 22.5.1 pp. 553-556.

* cited by examiner

NANO-ENABLED MEMORY DEVICES AND ANISOTROPIC CHARGE CARRYING ARRAYS

CROSS-REFERENCE TO RELATED APPLICATIONS

This application is a divisional of U.S. patent application Ser. No. 11/018,572, filed Dec. 21, 2004, which is a continuation-in-part of U.S. patent application Ser. No. 10/962,972, filed Oct. 12, 2004, which is a continuation-in-part of U.S. patent application Ser. No. 10/796,413 filed Mar. 10, 2004, the disclosures of which are each incorporated herein for all purposes.

STATEMENT REGARDING FEDERALLY SPONSORED RESEARCH

Not Applicable

BACKGROUND OF THE INVENTION

The present invention relates to memory devices, and more particularly, to nano-enabled memory devices and charge carrying arrays.

An interest exists in industry in developing low cost electronics, and in particular, in developing low cost, large area electronic devices. Availability of such large area electronic devices could revolutionize a variety of technology areas, ranging from civil to military applications. Example applications for such devices include driving circuitry for active matrix liquid crystal displays (LCDs) and other types of matrix displays, smart libraries, credit cards, radio-frequency identification tags for smart price and inventory tags, security screening/surveillance or highway traffic monitoring systems, large area sensor arrays, and the like.

Accordingly, what is needed are higher performance conductive or semiconductive materials and devices, and methods and systems for producing lower-cost, high performance electronic devices and components.

Furthermore, what is needed are high performance TFTs that can be applied to plastics and other substrates requiring low process temperatures.

What is also needed is a production scalable method for fabrication of nanoscale semiconductor devices than can be used as high performance TFTs.

Furthermore, what are needed are improved, longer lasting non-volatile memory devices, and printing devices having greater resolution.

BRIEF SUMMARY OF THE INVENTION

Methods, systems, and apparatuses for nano-enabled memory devices and anisotropic charge carrying arrays are described. According to embodiments of the present invention, nanoelements are configured in various ways to provide for improved spatial charge storage, improved control of directional charge transfer, and reduced lateral charge transfer. These features of the present invention may be applied to a variety of devices, processes, structures, etc., to provide these benefits.

In a first aspect of the present invention, an improved memory device is described. The memory device is formed on a substrate, having a source region, a drain region, and a channel region. A thin film of nanoelements is formed on the substrate in the channel region. A gate contact is formed on the thin film of nanoelements. In an example aspect, the memory device is a floating gate memory device. The nanoelements allow for reduced lateral charge transfer in the memory device, and therefore provide for longer lasting memory storage, and otherwise better performance.

In a further aspect, the memory device may be a single or multistate memory device. In a multistate memory device aspect, nanoelements are present in the thin film of nanoelements that have a plurality of different charge injection voltages, to provide multiple states for the memory device.

In another embodiment of the invention, a method of programming a memory device with a select number of electrons is disclosed, the memory device comprising one or more quantum dots or molecules having a plurality of discrete energy levels, the method comprising filling at least a portion of the plurality of discrete energy levels of each dot or molecule with a plurality of electrons, and then removing individual electrons one at a time from one or more discrete energy level of the one or more dots or molecules until the select number of electrons remain on the one or more quantum dots or molecules. The step of removing electrons may comprise, for example, applying a plurality of voltage potentials between the channel region and a gate contact of the memory device, wherein each applied voltage potential is sufficient to remove individual electrons one at a time from the one or more discrete energy level. The removing step may also comprise applying a threshold voltage potential between the channel region and the gate contact of the memory device, wherein the applied voltage potential is sufficient to remove individual electrons one at a time from the one or more discrete energy level over time until the select number of electrons remain on the one or more quantum dots or molecules.

A method of controlling the erase and retention time of a memory device comprising one or more quantum dots or molecules having a plurality of discrete energy levels is further disclosed which generally comprises selectively varying an average number of electrons stored on each of the one or more quantum dots or molecules between at least a first state and a second state of the memory device to control the erase and retention time of the device. For example, the memory device in the first state may be operated as a predominantly fast erase, short retention time device by programming each dot with between about 7 to 10 electrons per dot, for example. The device in the first state may be operated in a write/read/erase operation by controlling the number of electrons on each dot to be between the stored 7 to 10 electrons per dot, for example. The memory device in the second state may be operated as a predominantly slow erase, long retention time device by programming each dot with between about 0 to 3 electrons per dot, for example. The device in the second state may be operated in a write/read/erase operation by controlling the number of electrons on each dot to be between the stored 0 to 3 electrons per dot, for example. The presence of absence of these varied charge states on the dots can be used to indicate a logic 1 or 0 for a single-state device (or multiple states for a multi-bit device), discovered by measuring the transistor output at a given gate voltage.

In another aspect of the present invention, an improved printing device is described. The printing device includes a charge diffusion layer that includes a matrix containing a plurality of electrically conductive nanoelements that are anisotropically conductive between a first surface and a second surface of the charge diffusion layer. An electrode is coupled to the second surface of the charge diffusion layer.

In a further aspect, a photoconductor layer is coupled between the charge diffusion layer and the electrode. Optics are configured to direct light to the photoconductor layer, where the light defines a latent image of an object to be printed.

In an alternative printing device aspect, the nanoelements are photoconductive, and the photoconductor layer is not required. The optics are configured to direct the light to the photoconductive nanoelements, where the light defines the latent image of the object to be printed.

In a further aspect, a coating layer is formed on the charge diffusion layer. The coating layer receives a target print surface, such as a sheet of paper. Alternatively, the first surface of said charge diffusion layer is configured (e.g., polished, hardened, etc.) to directly receive the target print surface, without a coating layer being necessary.

Thus, according to aspects of the present invention, nanowire, nanorod, nanoparticle, nanoribbon, and nanotube configurations and thin films enable a variety of new capabilities. In aspects, these include: moving microelectronics from single crystal substrates to glass and plastic substrates; integrating macroelectronics, microelectronics and nanoelectronics at the device level; and, integrating different semiconductor materials on a single substrate. These aspects of the present invention impact a broad range of existing applications, from flat-panel displays to image sensor arrays, and enable a whole new range of universal flexible, wearable, disposable electronics for computing, storage and communication, flash memory devices, and other types of memory devices, printing devices, etc.

These and other objects, advantages and features will become readily apparent in view of the following detailed description of the invention. Various ones of the foregoing objects, advantages, and/or features may impart patentability independently of the others.

BRIEF DESCRIPTION OF THE DRAWINGS

The accompanying drawings, which are incorporated herein and form a part of the specification, illustrate the present invention and, together with the description, further serve to explain the principles of the invention and to enable a person skilled in the pertinent art to make and use the invention.

Figure 1:
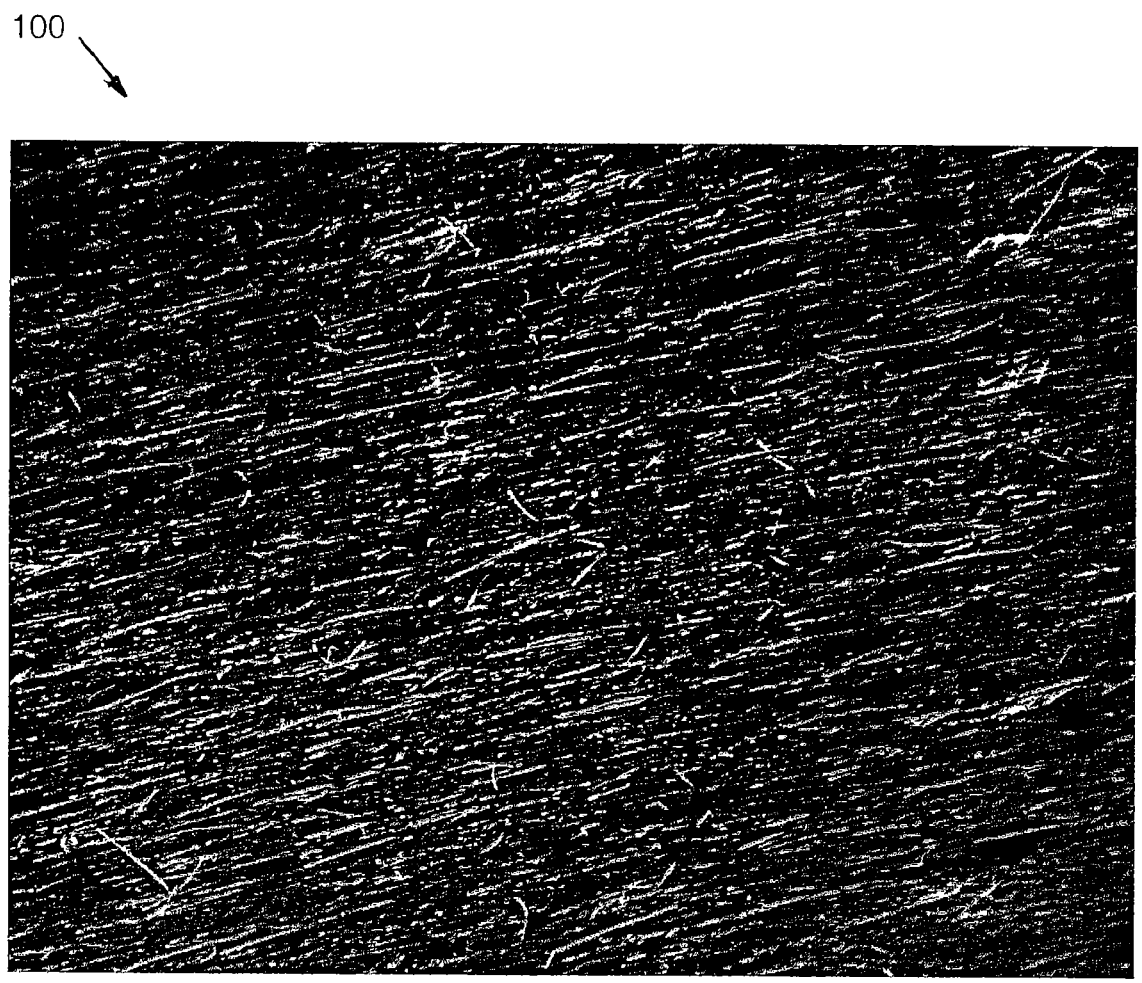
FIG. 1 shows a view of a portion of a thin film of nanowires, according to an example embodiment of the present invention.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW), nanorod, nanotube, and nanoribbon technologies and other functional aspects of the systems (and components of the individual operating components of the systems) may not be described in detail herein. Furthermore, for purposes of brevity, the invention is frequently described herein as pertaining to nanowires, and to a semiconductor transistor device. Moreover, while the number of nanowires and spacing of those nanowires are provided for the specific implementations discussed, the implementations are not intended to be limiting and a wide range of the number of nanowires and spacing can also be used. It should be appreciated that although nanowires are frequently referred to, the techniques described herein are also applicable to nanorods, nanotubes, and nanoribbons. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length: width) of greater than 10, preferably greater than 50, and more preferably, greater than 100. Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions.

As used herein, the term "nanorod" generally refers to any elongated conductive or semiconductive material (or other material described herein) similar to a nanowire, but having an aspect ratio (length:width) less than that of a nanowire. Note that two or more nanorods can be coupled together along their longitudinal axis so that the coupled nanorods span all the way between any two or more points, such as contacts or electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

As used herein, the term "nanoparticle" generally refers to any conductive or semiconductive material (or other material described herein) similar to a nanowire/nanorod, but having an aspect ratio (length:width) less than that of a nanorod, including an aspect ratio of 1:1. Note that two or more nanoparticles can be coupled together so that the coupled nanoparticles span all the way between any two or more points, such as contacts or electrodes. Alternatively, two or more nanoparticles can be substantially aligned, but not coupled together, such that a small gap exists between them. In this case, electrons can flow from one nanoparticle to another by hopping from one nanoparticle to another to traverse the small gap. The two or more nanoparticles can be substantially aligned (e.g., chemically, by electrical charge/ electrical field, etc.), such that they form a path by which electrons can travel between electrodes. Note that a "nanoparticle" can be referred to as a "quantum dot."

While the example implementations described herein principally use CdS and Si, other types of materials for nanowires and nanoribbons can be used, including semiconductive nanowires or nanoribbons, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/ InSb, BN/BP/BAs, AlN/AlP/AlAs/AlSb, GaN/GaP/GaAs/ GaSb, InN/InP/InAs/InSb, ZnO/ZnS/ZnSe/ZnTe, CdS/ CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, CaCN2, ZnGeP2, CdSnAs2, ZnSnSb2, CuGeP3, CuSi2P3, (Cu, Ag)(Al, Ga, In, Tl, Fe)(S, Se, Te)2, Si3N4, Ge3N4, Al2O3, (Al, Ga, In)2(S, Se, Te)3, Al2CO, and an appropriate combination of two or more such semiconductors.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

Furthermore, it is noted that a thin film of nanowires of the present invention can be a "heterogeneous" film, which incorporates semiconductor nanowires and/or nanotubes, and/or nanorods, and/or nanoribbons, and/or any combination thereof of different composition and/or structural characteristics. For example, a "heterogeneous film" can includes nanowires/nanotubes with varying diameters and lengths, and nanotubes and/or nanotubes that are "heterostructures" having varying characteristics.

In the context of the invention, although the focus of the detailed description relates to use of nanowire, nanorod, nanotube, or nanoribbon thin films on semiconductor substrates, the substrate to which these nano structures are attached may comprise any materials, including, but not limited to: a uniform substrate, e.g., a wafer of solid material, such as silicon or other semiconductor material, glass, quartz, polymerics, etc.; a large rigid sheet of solid materials, e.g., glass, quartz, plastics such as polycarbonate, polystyrene, etc., or can comprise additional elements, e.g., structural, compositional, etc. A flexible substrate, such as a roll of plastic such as polyolefins, polyamide, and others, a transparent substrate, or combinations of these features can be employed. For example, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

It should be understood that the spatial descriptions (e.g., "above", "below", "up", "down", "top", "bottom", etc.) made herein are for purposes of illustration only, and that devices of the present invention can be spatially arranged in any orientation or manner.

I. Nano-enabled Charge Carrying Array Embodiments

According to embodiments of the present invention, nanomaterials/nanoelements (e.g., nanowires, nanorods, nanoparticles, etc.) are grown and/or deposited in a manner to provide anisotropic conductivity to allow for spatial charge storage and/or controlled directional charge transfer. In an embodiment, nanoelements are present in materials to allow for spatial charge storage in the materials, with little or no lateral charge transfer. In further embodiments, nanoelements are present in materials to provide the materials with electrical connectivity in one or more desired directions, while having little or no electrical connectivity in other directions. This can benefit many charge based applications, including floating gate memory devices (with improved gate structure for lower voltage, better retention, and potentially increased storage capacity), photocopiers/laser printers (improved resolution/sensitivity and cost), and other applications. For illustrative purposes, example printing device and floating gate memory device embodiments utilizing these aspects of the present invention are described in further detail below. However, it is to be understood that the spatial charge storage and/or directional charge transfer aspects of the present invention are applicable to many further applications. These further applications are also within the scope and spirit of the present invention.

a. Printing Device Embodiments

As described above, the enhanced spatial charge storage, directional charge transfer, and reduced adjacent charge transfer aspects of the present invention are applicable to printing applications. Examples embodiments of such printing devices/applications are described in this subsection.

A typical printing device includes a light source and optical components ("optics"). The optics direct light from the light source containing a latent image of an object to be printed/copied, such as text and/or drawings, to a developing unit. The developing unit typically includes a photosensitive portion, and is generally formed as a drum, belt, or plate. The light containing the latent image is used to form an electrostatic latent image on the surface of the charged photosensitive portion of the developing unit. Toner is supplied from a toner cartridge and applied to the electrostatic latent image, causing the latent image to be formed into a preliminary image in toner. Printing paper is transferred (typically by rollers) over the photosensitive surface, and the preliminary image of toner is transferred to the printing paper.

Figure 7:
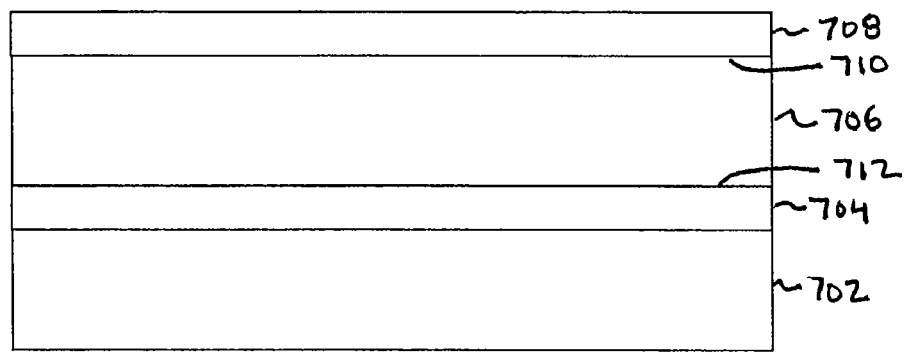
FIG. 7 shows a cross-sectional view of a portion of a developing unit for a printing device.

FIG. 7 shows a cross-sectional view of a portion of a developing unit 700 of a printing device, such as a photocopier or laser printer. Developing unit 700 is a conventional printer developing unit that does not include the enhanced spatial charge storage and/or reduced adjacent charge transfer aspects of the present invention. As shown in FIG. 7, developing unit 700 is formed as a stack of materials or layers. Developing unit 700 includes an electrode 702, a photoconductor layer 704, a charge diffusion layer 706, and a coating layer 708. Photoconductor layer 704 is coupled between electrode 702 and a bottom surface 712 of charge diffusion layer 706. Coating layer 708 is formed on a top surface 710 of charge diffusion layer 706.

Electrode 702 is typically made from a metal, such as aluminum. An electrical potential difference is maintained between electrode 702 and top surface 710/coating layer 708. For example, the electrical potential difference can be any applicable value, including 100 Volts.

Figure 8:
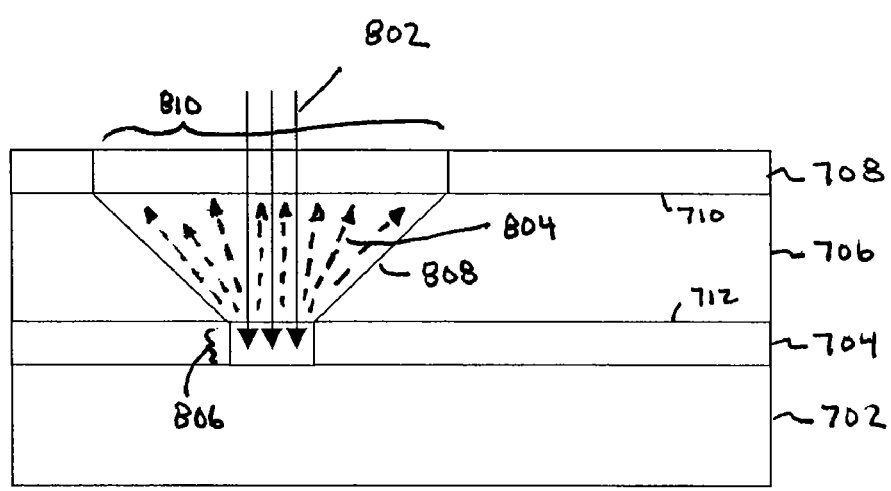
FIG. 8 illustrates example operation of the developing unit of FIG. 7.

FIG. 8 illustrates example operation of developing unit 700. In the example of FIG. 8, a print image is desired to be printed on paper. Optical components ("optics") of the printing device direct light 802 defining the latent print image to photoconductor layer 704. Layers 806 of different conductivity corresponding to areas of light and dark of the print pattern are created in photoconductor layer 704. These differences in conductivity cause a charge representative of the latent image to be transferred from photoconductor layer 704 to charge diffusion layer 706. For example, a charge 804 is shown in FIG. 8 (as dotted line arrows), representing at least a portion of the charge to be transferred. Charge 804 is transferred within a path 808 through charge diffusion layer 706 to the outer layer or surface (e.g., coating layer 708).

Toner or other printing material is applied to coating layer 708. The toner adheres to areas of coating layer 708 that are charged, such as area 810, which is charged by charge 804. A sheet of paper or other target print surface can be applied to coating layer 708 to receive the toner. The toner is received in areas of the target print surface corresponding to the areas of coating layer 708 to which the toner adheres (such as area 810). A resolution of the resulting print image is determined by the lateral diffusion of the charge in charge diffusion layer 706 (i.e., diffusion in a direction perpendicular to the direction of light 802 shown in FIG. 8). This lateral diffusion of charge 804 is represented by the increasing width of path 808 as charge 804 approaches coating layer 708. The more lateral diffusion of charge that occurs, the lower the possible resolution of the resulting print object.

Figure 9:
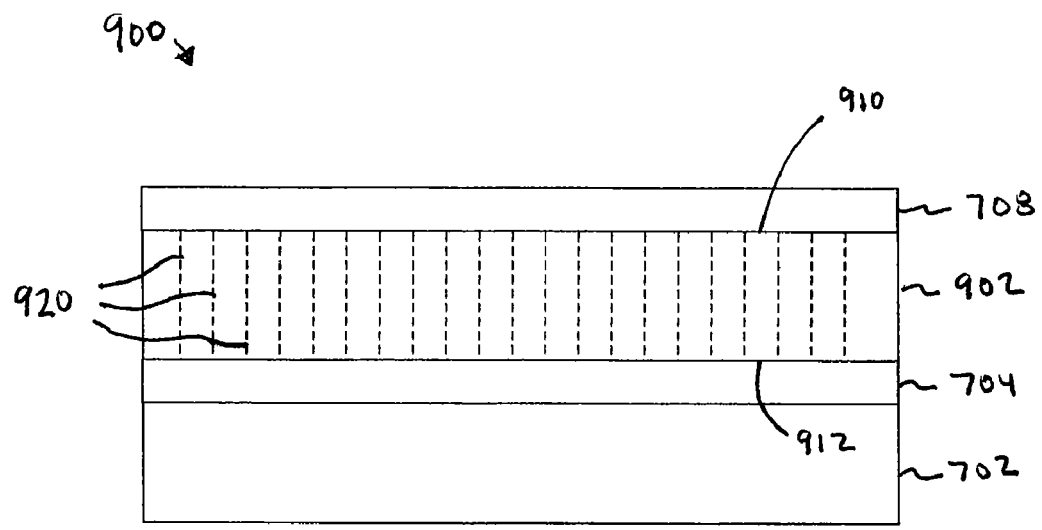
FIG. 9 shows a cross-sectional view of a portion of a developing unit for a printing device.

Embodiments of the present invention allow for improved resolution when compared to developing unit 700. FIG. 9 shows a cross-sectional view of a portion of a developing unit 900 of a printing device, according to an example embodiment of the present invention. As shown in FIG. 9, developing unit 900 is generally similar to developing unit 700 of FIG. 7. However, developing unit 900 includes a charge diffusion layer 902, which includes nanoelements 920 that provide for reduced lateral diffusion of charge 804, for increased resolution.

Photoconductor layer 704 is coupled between electrode 702 and a bottom surface 912 of charge diffusion layer 902. Coating layer 708 is formed on a top surface 910 of charge diffusion layer 902. As shown in FIG. 9, nanoelements 920 are configured to provide electrical connectivity within charge diffusion layer 902, between top surface 910 and bottom surface 912.

Figure 10:
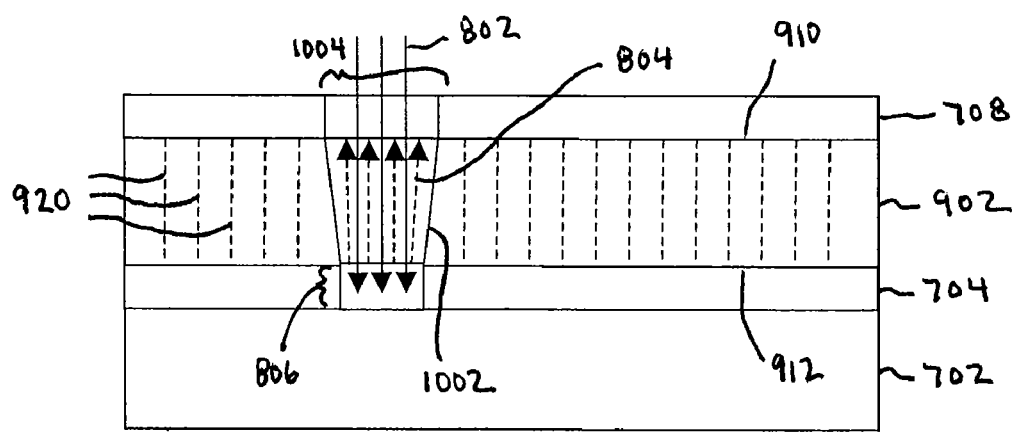
FIG. 10 illustrates example operation of the developing unit of FIG. 9, according to an example embodiment of the present invention.

FIG. 10 illustrates example operation of developing unit 900. As shown in FIG. 10, light 802 is directed toward photoconductor layer 704. Note that light 802 can be produced by any suitable light source, such as a laser, one or more light emitting diodes (LEDs), a liquid crystal diode array, or other light source. Any type of optics may be used as needed to guide light 802 toward photoconductor layer 704, including one or more lenses, prisms, and/or mirrors. Digital light processing (DLP) may be used, including digital micromirror devices (DMD) for example.

As shown in FIG. 10, charge 804 is transferred through charge diffusion layer 902 to coating layer 708 within the width of a path 1002. Path 1002 exhibits less lateral diffusion of charge 804 as compared to path 808 shown in FIG. 8. Toner adheres to areas of coating layer 708 that are charged, such as an area 1004. Thus, a print image generated by developing unit 900 has a greater possible resolution than a print image generated by conventional developing unit 700.

Charge diffusion layer 902 includes nanoelements 920 that are configured to be anisotropically (e.g., unidirectionally) electrically conductive between top surface 910 and bottom surface 912, to transfer charge through charge diffusion layer 902 to areas of top surface 910. As a result, charge diffusion layer 902 is anisotropically conductive, having little or no lateral charge flow. The anisotropic nature of nanoelements 920 provides for the enhanced resolution of developing unit 900, as charge does not spread laterally, but only vertically between top and bottom surfaces 910 and 912.

FIG. 1 illustrates a cross-sectional view of a portion of charge diffusion layer 902 in further detail, showing an example plurality of nanoelements, according to an embodiment of the present invention. As shown in the example of FIG. 1, the nanoelements are nanowires 1102. Nanowires 1102 are held in a non-electrically conductive (i.e., electrically insulating) matrix 1104. Nanowires 1102 are configured in matrix 1104 to be anisotropically electrically conductive between top surface 910 and bottom surface 912 to transfer charge through charge diffusion layer 902 to areas of top surface 910. Nanowires 1102 are each conductive along their lengths, so can transfer charge along each of their lengths. Furthermore, because nanowires 1102 are parallel to each other, and are not in contact with other nanowires 1102 (or a negligible or acceptable quantity of nanowires 1102 are in contact), there is little or no capacity for charge to transfer or spread laterally in charge diffusion layer 902.

Figure 12:
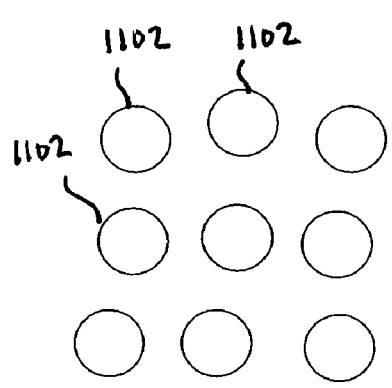
FIGS. 12 and 13 show example plan views of portions of charge diffusion layers, according to example embodiments of the present invention.

FIG. 12 shows an example plan view of a portion of charge diffusion layer 902, according to an example embodiment. As shown in FIG. 12, nanowires 1102 are uniformly conductive nanowires, such as metallic or single crystal type nanowires.

Figure 13:
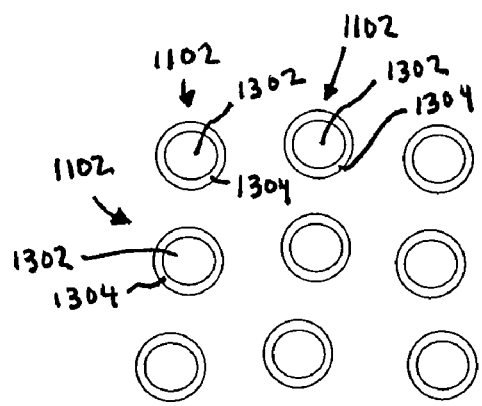

FIG. 13 shows an example plan view of a portion of charge diffusion layer 902, according to another example embodiment. As shown in FIG. 13, nanowires 1102 each have a core 1302 and a surrounding shell 1304, similar to as described below for nanowires 310 and 420 shown in FIGS. 3 and 4. Core 1302 and shell 1304 can be differently doped regions of a nanowire 1102, or can be different materials.

Figure 14:
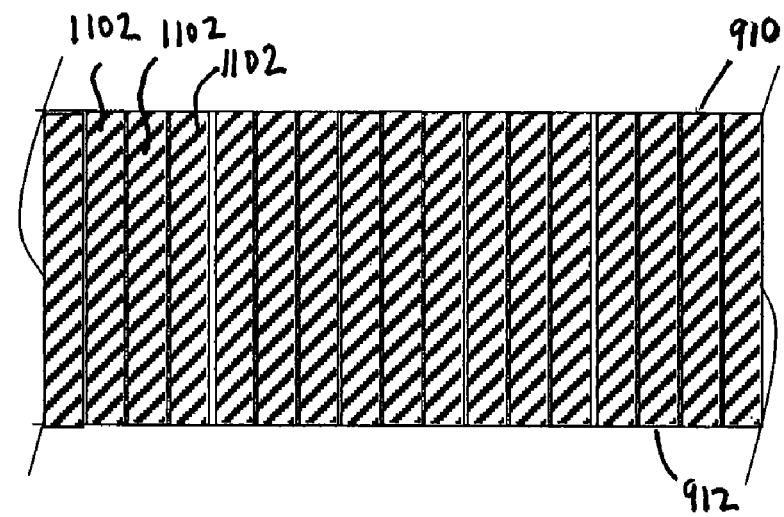
FIG. 14 shows a cross-sectional view of a charge diffusion layer where nanowires 1102 are closely packed, according to an example embodiment of the present invention.

In an embodiment, shell 1304 can be an electrically insulating outer layer for a nanowire 1102. In such an embodiment, nanowires 1102 can be closely packed such that adjacent nanowires 1102 are in contact with each other, while still preserving anisotropic electrical connectivity. For example, FIG. 14 shows a cross-sectional view of charge diffusion layer 902, where nanowires 1102 are closely packed, and have an electrically insulating outer layer similar to shell 1304 shown in FIG. 13. In such an embodiment, due to the density of nanowires 1102 in charge diffusion layer 902, a relatively large amount of charge may be conducted from bottom surface 912 to top surface 910. Furthermore, because nanowires 1102 have electrically insulating outer layers, little or no lateral charge spreading occurs in charge diffusion layer 902.

Figure 15:
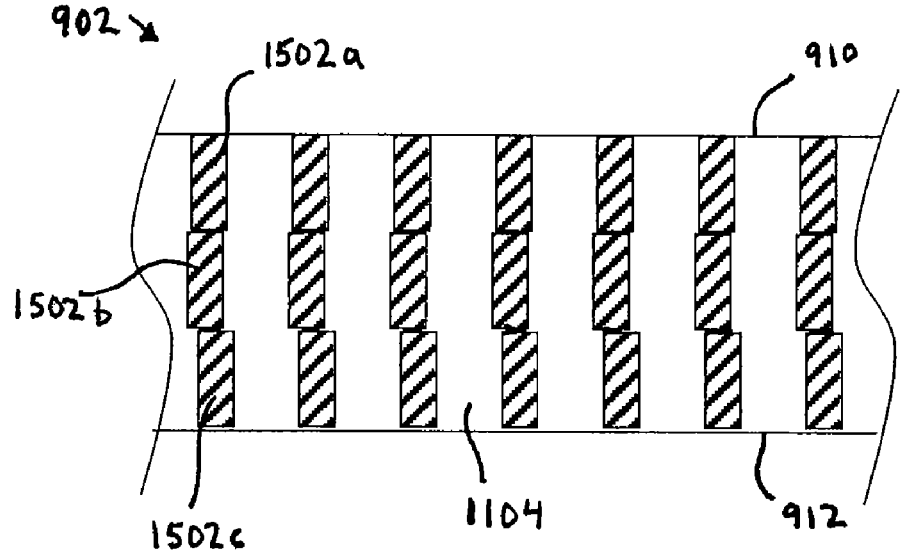
FIG. 15 illustrates a cross-sectional view of a portion of a charge diffusion layer having a plurality of nanorods as nanoelements, according to an embodiment of the present invention.

Note that any type of nanoelements, or combinations thereof, may be present in charge diffusion layer 902 to provide anisotropic electrical connectivity. For example, FIG. 15 illustrates a cross-sectional view of a portion of an example charge diffusion layer 902 in further detail, showing an example plurality of nanoelements, according to an embodiment of the present invention. As shown in the example of FIG. 15, the nanoelements are nanorods 1502. Nanorods 1502 are configured to provide anisotropic electrical connectivity across charge diffusion layer 902, with little or no lateral diffusion of charge. As shown in FIG. 15, layers or stacks of nanorods 1502 are used to form electrical connections between top and bottom layers 910 and 912. For example, three nanorods 1502a, 1502b, and 1502c are in serial contact or are closely positioned to create a single electrical path between top and bottom surfaces 910 and 912. Furthermore, nanorods 1502 can be uniform and/or have core/shell structures similar to nanowires 1102 of FIGS. 12 and 13, and can alternatively be closely packed similarly to nanowires 1102 of FIG. 14. Although multiple nanorods 1502 are used to form an electrical connection between surfaces of charge diffusion layer 902 in FIG. 15, it is to be understood that a single layer of nanorods 1502 could alternatively be used.

Figure 16:
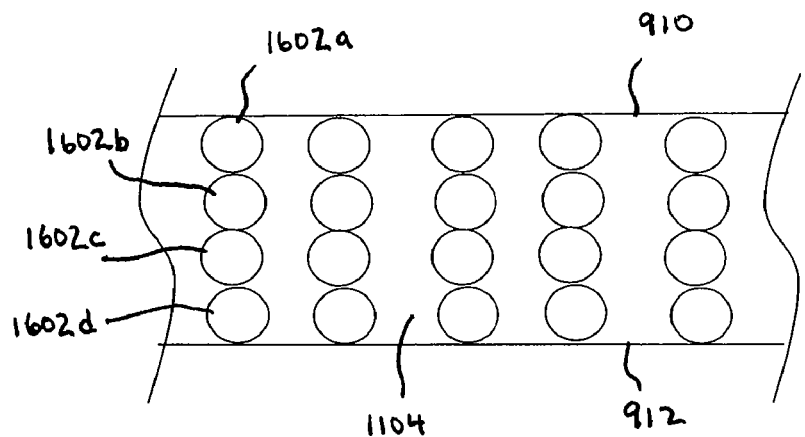
FIG. 16 illustrates a cross-sectional view of a portion of a charge diffusion layer having a plurality of nanowires as nanoelements, according to an embodiment of the present invention.

In another example, FIG. 16 illustrates a cross-sectional view of a portion of an example charge diffusion layer 902 in further detail, showing nanoparticles 1602 as nanoelements, according to an embodiment of the present invention. Nanoparticles 1602 are configured to provide anisotropic electrical connectivity across charge diffusion layer 902, with little or no lateral diffusion of charge. As shown in FIG. 16, layers or stacks of nanoparticles 1602 are used to form electrical connections between top and bottom layers 910 and 912. For example, four nanoparticles 1602a, 1602b, 1602c, and 1602d are in serial contact or are closely positioned to create a single electrical path between top and bottom surfaces 910 and 912. Furthermore, nanoparticles 1602 can be uniform and/or have core/shell structures similar to nanowires 1102 of FIGS. 12 and 13, and can alternatively be closely packed similarly to nanowires 1102 of FIG. 14. Although multiple nanoparticles 1602 are used to form an electrical connection between surfaces of charge diffusion layer 902 in FIG. 16, it is to be understood that a single layer of nanoparticles 1602 could alternatively be used.

Charge diffusion layer 902 can be formed in a variety of ways, including any nanoelement deposition or growth technique. For example, in the case of nanowires or nanorods, the nanowires or nanorods can be grown in the desired direction of high conductivity, or the nanowires/nanorods can be deposited or arranged in desired direction after they are grown or otherwise formed.

In an embodiment, matrix 1104 can be applied in a liquid state. A suitable electric field can then be applied in the direction of desired conductivity so that the nanoelements orient in that direction to minimize their energy. This can include single layers of nanoelements, or stacks/layers of elements such as shown in FIGS. 15 and 16. Matrix 1104 can then be cured, frozen, cross-linked, or otherwise made solid to form charge diffusion layer 902.

Note that the nanoelements can be grown from a conductive material, or the nanoelement material can be doped to be conductive after growth/formation of the nanoelement. The nanoelements can be made from a wide variety of materials, including metals (such as silver or zinc), a combination of metals/alloy, semiconductors (including organic conductors or semiconductors), and/or from any other material described elsewhere herein or otherwise known to persons skilled in the relevant art(s).

Matrix 1104 can be any insulating material, such as glass, plastic, a polymer, an epoxy, or other insulating material. For further description of suitable materials for matrix 1104, and for forming a nanoelement/matrix combination, including forming composites that include nanowires, refer to U.S. Ser. No. 60/491,979, titled "System and Process for Producing Nanowire Composites and Electronic Substrates Therefrom," filed on Aug. 4, 2003, which is incorporated herein in its entirety.

Figure 17A:
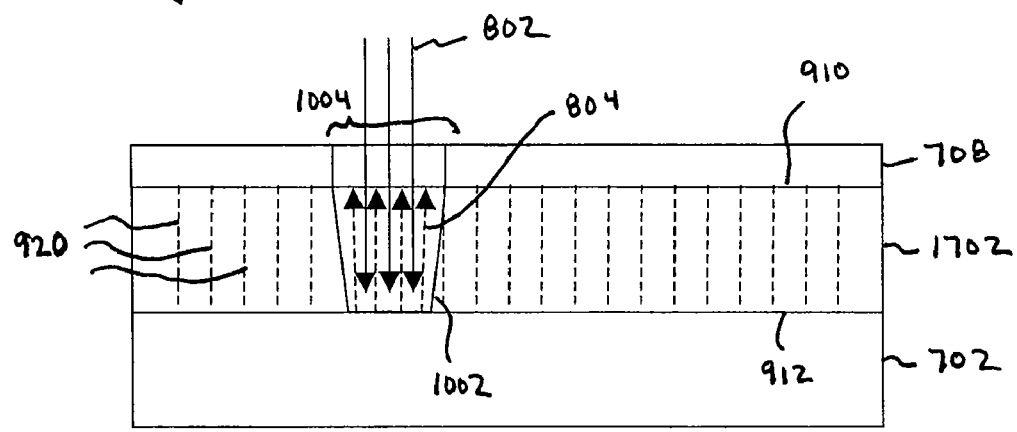
FIGS. 17A, 17B, and 18 show cross-sectional views of portions of printer device developing units, according to example embodiments of the present invention.

FIG. 17A shows a cross-sectional view of a portion of a developing unit 1700, according to another example embodiment of the present invention. As shown in FIG. 17A, developing unit 1700 is generally similar to developing unit 900 of FIG. 9. However, developing unit 1700 does not require a photoconductor layer 704. Instead, nanoelements 920 of charge diffusion layer 1702 are photoconductive. Upon receiving light 802, the photoconductive nanoelements 920 produce charge 804. Furthermore, the photoconductive nanoelements 920 transfer charge 804 to top surface 910. Thus, charge diffusion layer 1702 performs the functions of both of charge diffusion layer 902 and photoconductor layer 704.

A printing device that includes developing unit 1700 can operate as a black and white printer. Alternatively, the photoconductive nanoelements can be tuned to one or more colors (i.e., wavelengths) for use in color printing devices, such as color copiers or laser printers.

Figure 17B:
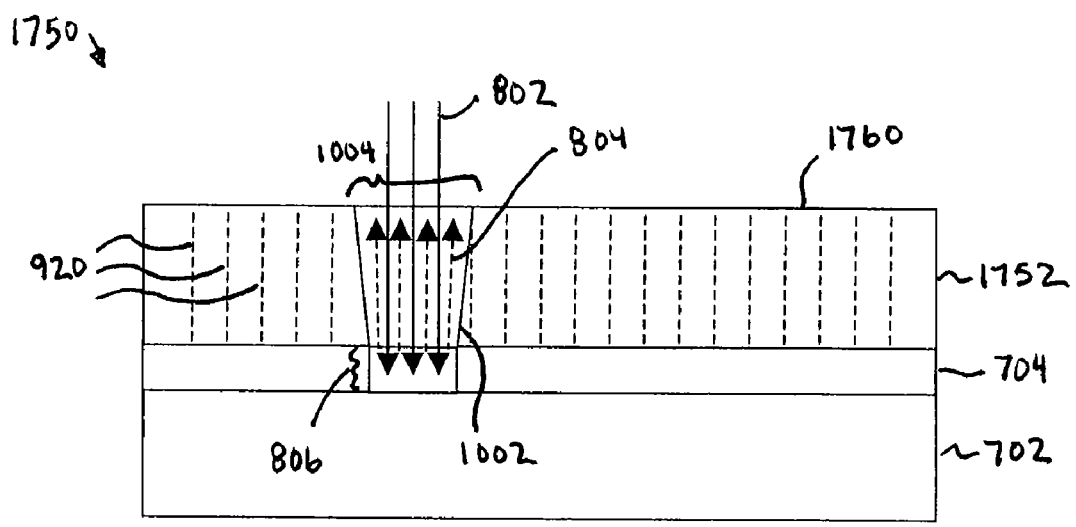

FIG. 17B shows a cross-sectional view of a portion of a developing unit 1750, according to another example embodiment of the present invention. As shown in FIG. 17B, developing unit 1750 is generally similar to developing unit 900 of FIG. 9. However, developing unit 1750 does not require a coating layer 708. Instead, top surface 1760 of charge diffusion layer 1752 functions as the coating layer. For example, top surface 1760 of charge diffusion layer 1752 can be polished and/or otherwise processed to be smooth and hard, similarly to coating layer 708. In this manner, top surface 1760 will be durable enough to continually receive paper or other target print surfaces during operation of the printing device.

Figure 18:
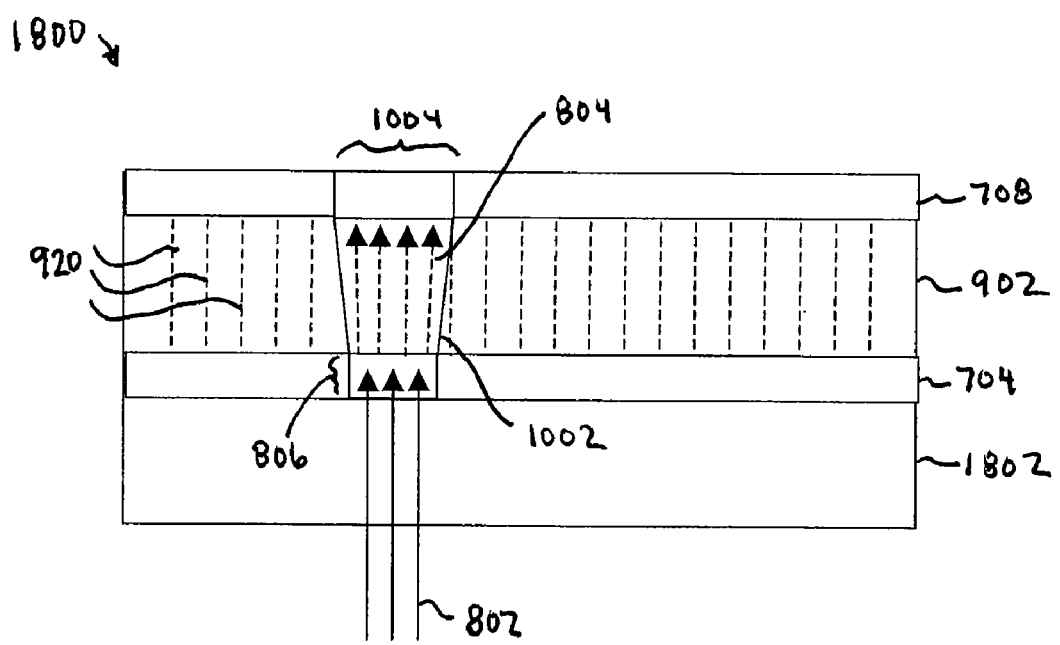

FIG. 18 shows a cross-sectional view of a portion of a developing unit 1800, according to another example embodiment of the present invention. As shown in FIG. 18, developing unit 1800 is generally similar to developing unit 900 of FIG. 9. However, developing unit 1800 can receive light 802 from the bottom (i.e., through electrode 1802). In the embodiment of FIG. 18, electrode 1802 is made from a material that is transparent to the frequency(s) of light 802. For example, electrode 1802 can be made from indium tin oxide (ITO) or other transparent conductor.

Figure 19:
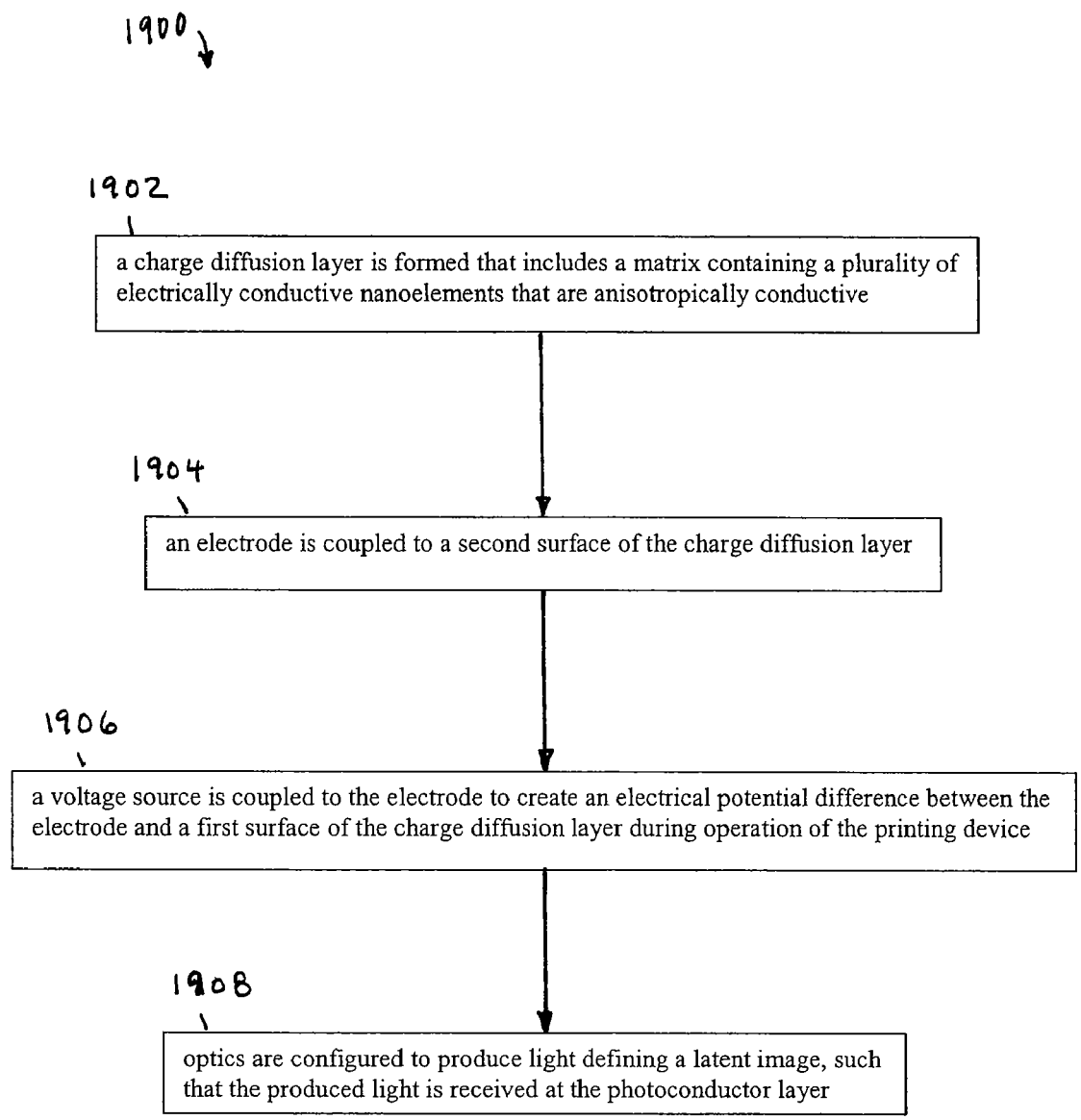
FIG. 19 shows a flowchart for fabricating a printer device developing unit, according to an example embodiment of the present invention.

FIG. 19 shows a flowchart 1900 providing example steps for fabricating a developing unit of a printing device, according to an example embodiment of the present invention. Other structural and operational embodiments will be apparent to persons skilled in the relevant art(s) based on the following discussion. The steps shown in FIG. 19 do not necessarily have to occur in the order shown. The steps of FIG. 19 are described in detail below.

Figure 11:
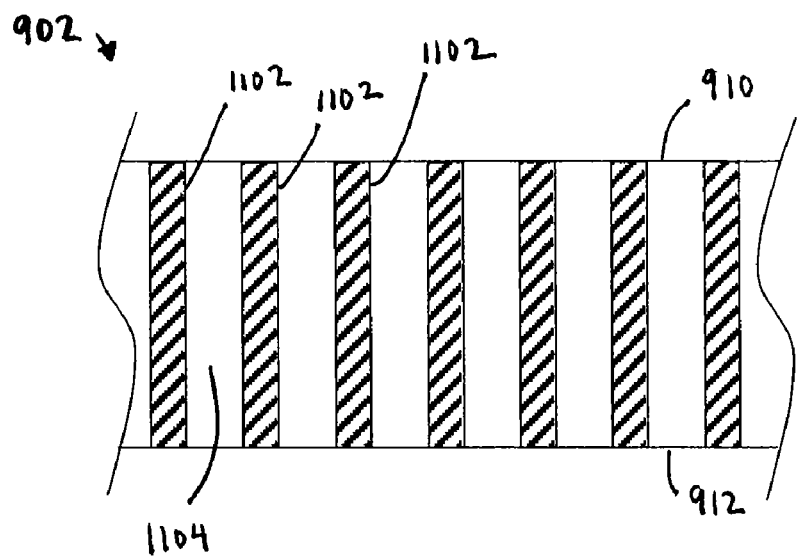
FIG. 11 illustrates a cross-sectional view of a portion of a charge diffusion layer having a plurality of nanowires as nanoelements, according to an embodiment of the present invention.

Flowchart 1900 begins with step 1902. In step 1902, a charge diffusion layer is formed that includes a matrix containing a plurality of electrically conductive nanoelements that are anisotropically conductive. For example, the charge diffusion layer is charge diffusion layer 902 shown in FIG. 9 (or charge diffusion layers 1702, 1752 shown in FIGS. 17A and 17B), having nanoelements 920. In another example, as shown in FIG. 11, a plurality of electrically conductive nanoelements (nanowires 1102) are shown formed in a matrix 1104. Nanowires 1102 are anisotropically electrically conductive between first surface 910 and second surface 912 of charge diffusion layer 902. Note that the nanoelements can alternatively be nanorods or nanoparticles, for example.

In step 1904, an electrode is coupled to a second surface of the charge diffusion layer. For example, as shown in FIG. 9, charge diffusion layer 706 is formed in a stack with electrode 702. Note that in an embodiment, a photoconductor layer (such as photoconductor layer 704) may be coupled between bottom surface 912 of charge diffusion layer 902 and electrode 702, as shown in FIG. 9, although this is not required when the nanoelements are photoconductive.

In step 1906, a voltage source is coupled to the electrode to create an electrical potential difference between the electrode and a first surface of the charge diffusion layer during operation of the printing device. For example, as described above, an electrical potential is present between electrode 702 and charge diffusion layer 902 (or charge diffusion layers 1702, 1752 shown in FIGS. 17A and 17B) during operation of the printing device, to cause charge transfer. Any suitable voltage source may be used by the printing device to create the electrical potential difference.

In step 1908, optics are configured to produce light defining a latent image, such that the produced light is received at the photoconductor layer. Note that alternatively, the optics can be configured to produce light defining the latent image, such that the produced light is received at the charge diffusion layer (e.g., when the photoconductor layer is not present).

In a further embodiment, flowchart 1900 can include the step where a coating layer is formed on the top surface of the charge diffusion layer. For example, the coating layer can be coating layer 708 shown in FIG. 9. Alternatively, the top surface of the charge diffusion layer may be polished or otherwise processed, and a coating layer is not required.

b. Nano-enabled Memory Device Embodiments

Embodiments of the present invention are provided in the following sub-sections for memory devices incorporating nanoelements (e.g., nanowires, nanorods, nanoparticles, etc.). As described below, the nanoelements provide for spatial charge storage, with little or no lateral charge transfer, as described above. Furthermore, the nanoelements allow for the creation of enhanced memory devices, such as multistate memory devices. These embodiments are provided for illustrative purposes, and are not limiting. The embodiments described herein may be combined in any manner. Additional operational and structural embodiments for the present invention will be apparent to persons skilled in the relevant art(s) from the description herein. These additional embodiments are within the scope and spirit of the present invention.

i. Memory Device Embodiments with Reduced Adjacent Charge Transfer

Nanomaterials/nanoelements are grown and/or deposited in such a way to provide anisotropic conductivity for the purpose of allowing spatial charge storage while minimizing adjacent charge transfer. This use of nanoelements can benefit many charge-based applications such as floating gate memory devices. One example type of floating gate memory device is an electrically erasable and programmable device known as a flash memory.

A conventional floating gate memory cell or structure is programmed by applying appropriate voltages to the source, drain, and control gate nodes of the memory structure for an appropriate time period. Electrons are thereby caused to tunnel or be injected from a channel region to a floating gate, which is thereby "charged." The charge stored on the floating gate sets the memory transistor to a logical "1" or "0." Depending on whether the memory structure includes an enhancement or depletion transistor structure, when the floating gate is neutral or contains electrons (negative charge), the memory cell will or will not conduct during a read operation. When the floating gate is neutral or has an absence of negative charge, the memory cell will conduct during a read operation. The conducting or non-conducting state is output as the appropriate logical level. "Erasing" is transferring electrons from the floating gate. "Programming" is transferring electrons onto the floating gate.

Figure 20:
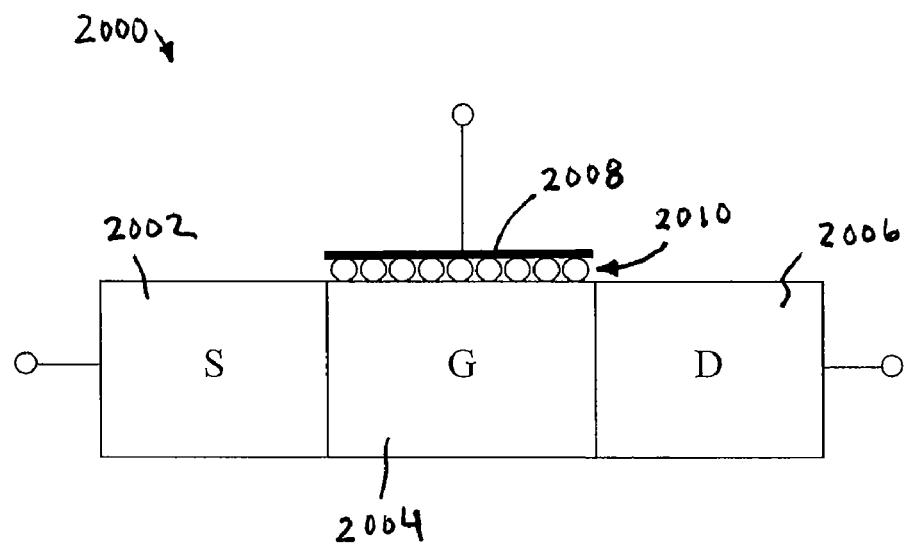
FIG. 20 shows a block diagram of a floating gate memory device, according to an example embodiment of the present invention.

The spatial charge storage aspects of the present invention can be used to enhance floating gate memory devices. For example, FIG. 20 shows a conceptual block diagram of a floating gate memory device 2000, according to an example embodiment of the present invention. Floating gate memory device 2000 has a source region 2002, a channel region 2004, and a drain region 2006, configured generally similar to a transistor configuration. Furthermore, floating gate memory device 2000 includes a gate contact 2008 and a thin film of nanoelements 2010. Thin film of nanoelements 2010 is formed on channel region 2004. Gate contact 2008 is formed on thin film of nanoelements 2010.

Floating gate memory device 2000 generally operates as described above for conventional floating gate memories. However, floating gate memory device 2000 includes thin film of nanoelements 2010. Thin film of nanoelements 2010 functions as a plurality of charge storage elements for the floating gate structure. In other words, when memory device 2000 is programmed, electrons are transferred to, and stored by thin film of nanoelements 2010. Nanoelements of thin film of nanoelements 2010 stores some charge. Thus, thin film of nanoelements 2010 allows for efficient spatial charge storage. Furthermore, thin film of nanoelements 2010 reduces adjacent charge transfer as compared to conventional floating gate memory devices.

Adjacent charge transfer is undesirable in a floating gate memory device. This is because if enough charge spontaneously transfers out of a floating gate of a floating gate memory device, the floating gate memory device can lose its programmed state. The nanoelements of thin film of nanoelements 2010 are configured to reduce such charge transfer.

Furthermore, in conventional floating gate memory devices, the floating gate area is typically a single continuous region. In such a configuration, if a single point of the continuous region breaks down and begins to lose charge, the entire region can lose its charge, causing the floating gate memory to lose its programmed state. However, embodiments of the present invention offer some protection from this problem. Because the nanoelements of thin film of nanoelements 2010 each separately store charge, and are insulated from one another, even if a single nanoelement loses charge, this will not likely affect the remaining nanoelements of thin film of nanoelements 2010. Thus, a floating gate memory device incorporating a thin film of nanoelements 2010, according to the present invention, is more likely to maintain a constant programmed state, over a much longer time than conventional floating gate memory devices.

Figure 21:
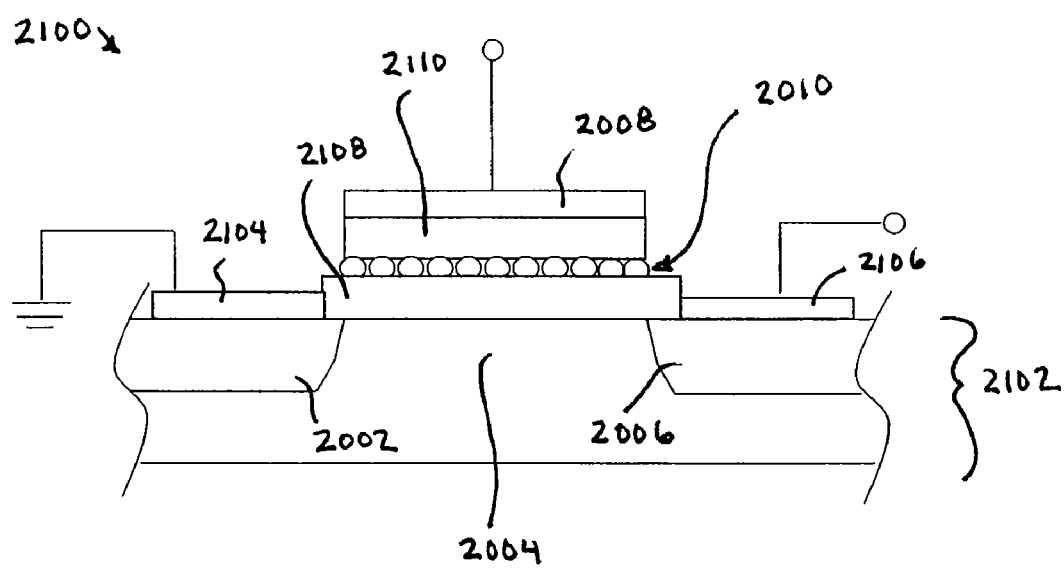
FIGS. 21 and 22 show detailed cross-sectional views of floating gate memory devices, according to example embodiments of the present invention.

FIG. 21 shows a detailed cross-sectional view of a floating gate memory device 2100, according to an example embodiment of the present invention. As shown in FIG. 21, floating gate memory device 2100 is formed on a substrate 2102. Floating gate memory device 2100 includes source region 2002, channel region 2004, drain region 2006, gate contact 2008, a thin film of nanoelements 2010, a source contact 2104, a drain contact 2106, a first insulator layer 2108, and a second insulator layer 2110.

In the current embodiment, substrate 2102 is a semiconductor type substrate, and is formed to have either P-type or N-type connectivity, at least in channel region 2004. Gate contact 2008, source contact 2104, and drain contact 2106 provide electrical connectivity to memory device 2100. Source contact 2104 is formed in contact with source region 2002. Drain contact 2106 is formed in contact with drain region 2006. Source and drain regions 2002 and 2006 are typically doped regions of substrate 2102, to have connectivity different from that of channel region 2004.

As shown in FIG. 21, source contact 2104 is coupled to a potential, such as a ground potential. Drain contact 2106 is coupled to another signal. Note that source and drain regions 2002 and 2006 are interchangeable, and their interconnections may be reversed.

Figure 22:
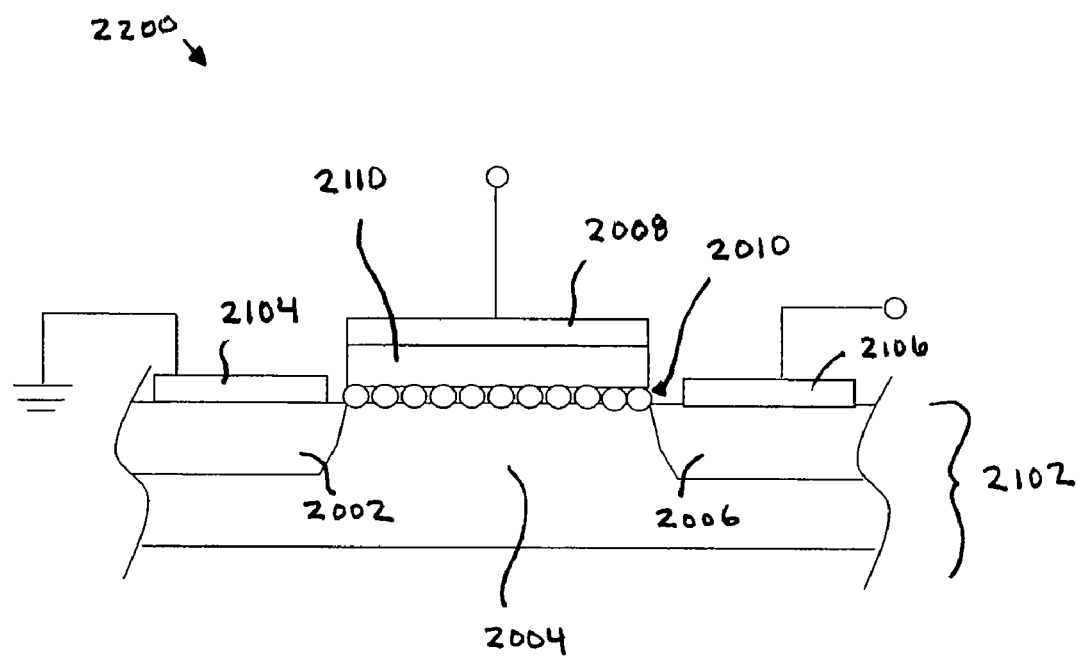

First and second insulator layers 2108 and 2110 can be any insulating material described elsewhere herein, or otherwise known. First and second insulator layers 2108 and 2110 are each optionally present. For example, FIG. 22 shows a cross-sectional view of an example floating gate memory device 2400 that does not include first insulating layer 2110, according to an embodiment of the present invention. In another embodiment, first and second insulating layers 2108 and 2110 are actually a single structure in which thin film of nanoelements 2010 has been formed. The insulating material of first and second insulating layers 2108 and 2110 can be used to hold the nanoelements in place, to keep them electrically isolated from each other, and/or to provide proper spacing from the channel region.

Figure 23:
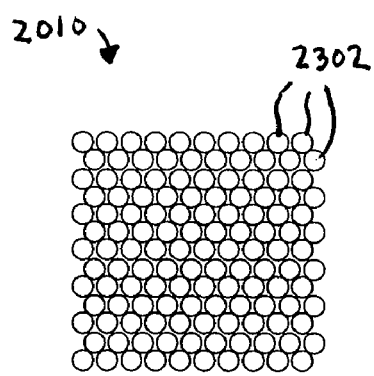
FIGS. 23 and 24 show plan views of example thin film of nanoelements, according to embodiments of the present invention.
Figure 24:
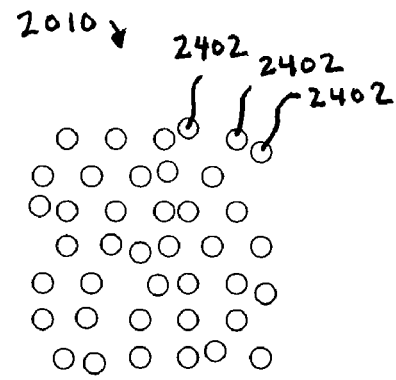
Figure 25:
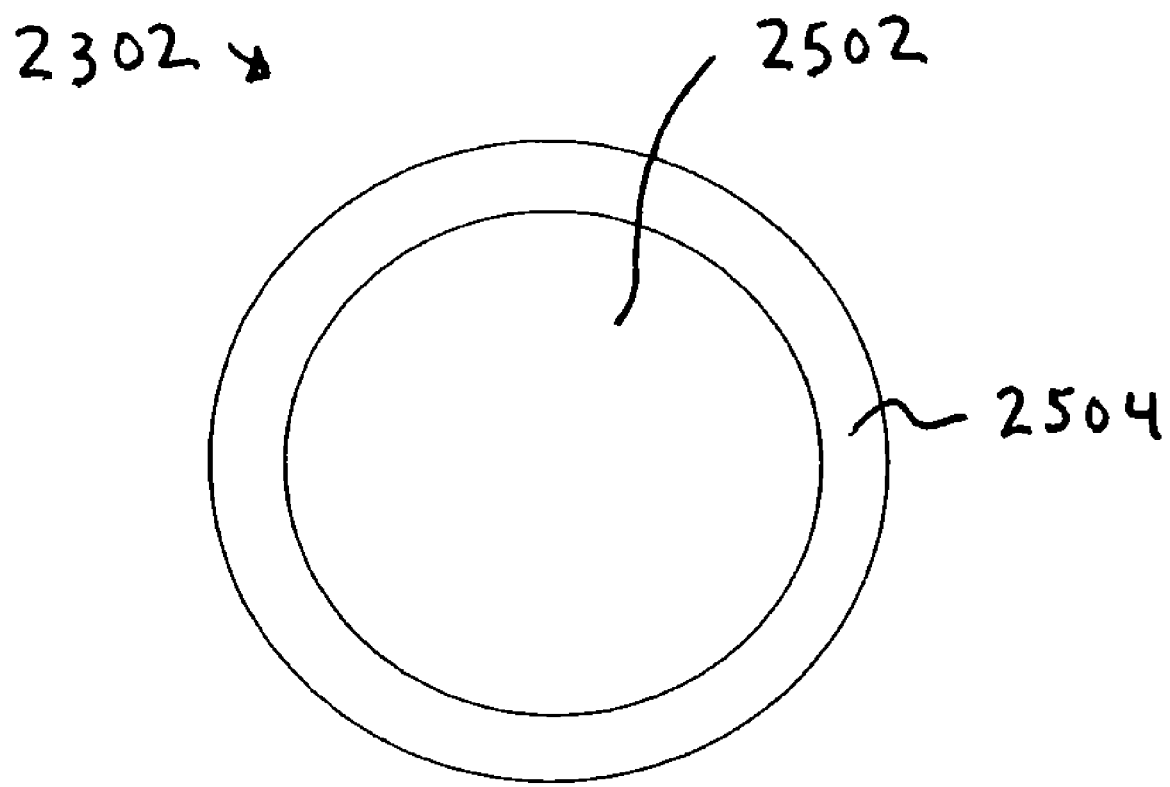
FIG. 25 shows an example nanoparticle having a core surrounded by an insulating shell, according to an embodiment of the present invention.

FIGS. 23 and 24 show example plan views for thin film of nanoelements 2010, according to embodiments of the present invention. FIG. 23 shows thin film of nanoelements 2010 having a plurality of nanoparticles 2302 as nanoelements. As shown in FIG. 23, nanoparticles 2302 are closely packed in thin film of nanoelements 2010, such that at least some of nanoparticles 2302 are in contact with each other. Thus, in such an embodiment, the nanoelements of thin film of nanoelements 2010 can have insulating shell layers to keep the nanoelements insulated from each other, although this is not required. For instance, it may be desired to keep the nanoelements insulated from each other to reduce lateral charge transfer among the nanoelements. For example, FIG. 25 shows an example nanoparticle 2302 having a core 2502 surrounded by an insulating shell 2504, according to an embodiment of the present invention. Insulating shell 2504 insulates nanoparticle 2302 from other nanoparticles, to reduce or eliminate lateral charge transfer within the thin film of nanoelements.

FIG. 24 shows thin film of nanoelements 2010 having plurality of nanoparticles 2402 that are not closely packed, and can be considered to form a sub-monolayer of nanoparticles 2402. As shown in FIG. 24, few if any of nanoparticles 2402 are in contact with each other. Thus, in such an embodiment, insulating shell layers are not required for nanoparticles 2402 (although they may be present if desired). This is because either no nanoparticles 2402 are in contact with each other, or a statistically acceptable small number of nanoparticles 2402 are in contact with each other, so that lateral charge transfer will be acceptably low.

Figure 26:
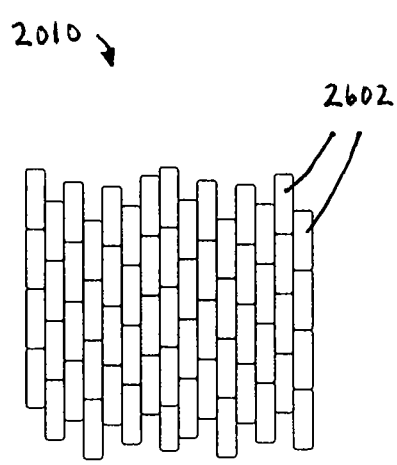
FIGS. 26-29 show plan views of example thin films of nanoelements, according to embodiments of the present invention.
Figure 27:
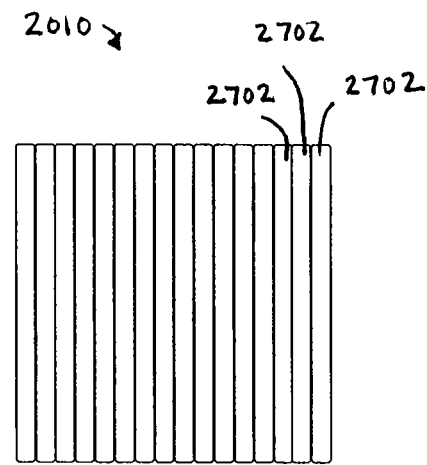
Figure 28:
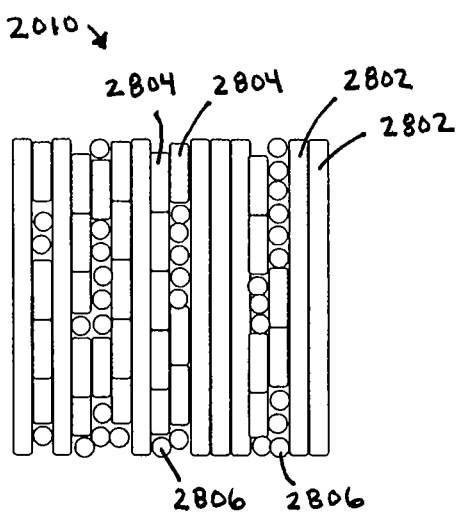
Figure 29:
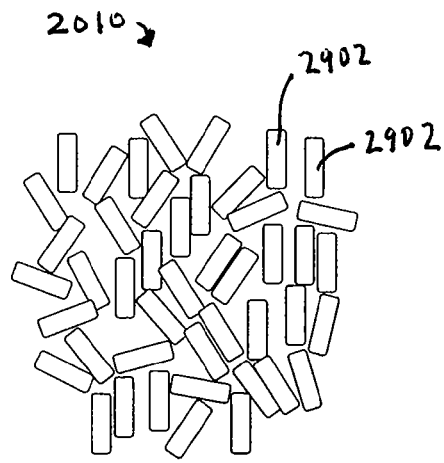

FIGS. 26-29 show plan views for further example thin films of nanoelements 2010, according to embodiments of the present invention. As shown in FIGS. 26-28, thin films of nanoelements can be formed having aligned nanoelements. For example, FIG. 26 shows a closely packed monolayer of aligned nanorods 2602 for thin film of nanoelements 2010. FIG. 27 shows a closely packed monolayer of aligned nanowires 2702 for thin film of nanoelements 2010. FIG. 28 shows a thin film of nanoelements 2010 containing a mixture or combination of nanoelements that are closely packed, and substantially aligned. As shown in FIG. 28, thin film of nanoelements 2010 can include a mixture of nanowires 2802, nanorods 2804, and nanoparticles 2806. Thin film of nanoelements 2010 can include any one or more nanoelement types, having or not having insulating shell layers, and configured in an aligned or non-aligned fashion. For example, FIG. 29 shows thin film of nanoelements 2010 including a plurality of non-aligned nanorods 2902.

Memory devices according to the present invention can be manufactured using conventional semiconductor device manufacturing techniques. For example, a coating/patterning step for the thin film of nanoelements can be inserted in a current CMOS manufacturing process. The coating process can be based on a solution of pre-mixed nanoelements.

Figure 30:
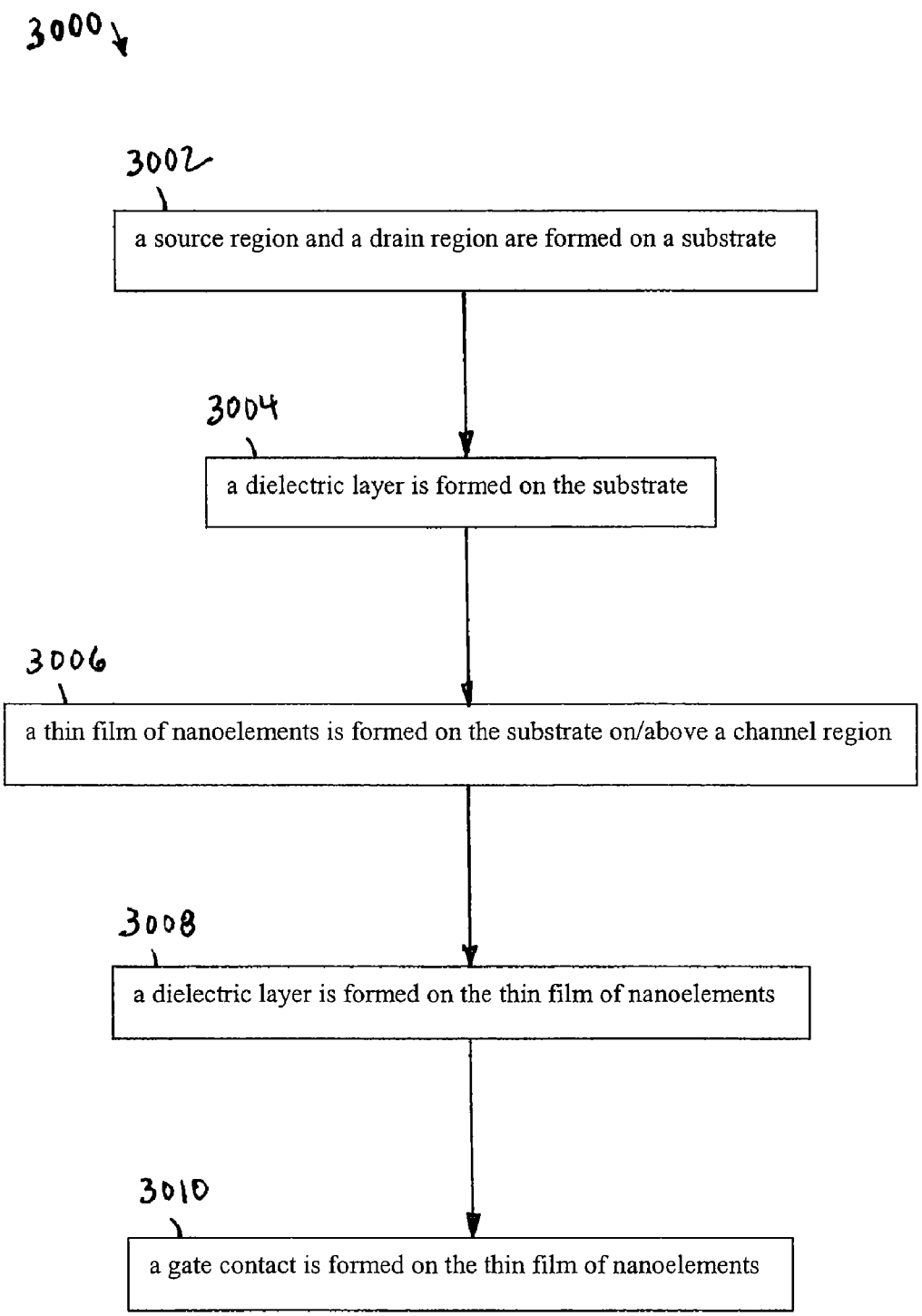
FIG. 30 shows a flowchart providing example steps for fabricating floating gate memory devices, according to an example embodiment of the present invention.

FIG. 30 shows a flowchart 3000 providing example steps for fabricating a floating gate memory device, according to an example embodiment of the present invention. For illustrative purposes, the steps of flowchart 3000 are described with respect to FIGS. 31-34, which show various stages in the fabrication of an example floating gate memory device, according to embodiments of the present invention. Other structural and operational embodiments will be apparent to persons skilled in the relevant art(s) based on the following discussion. The steps shown in FIG. 30 do not necessarily have to occur in the order shown. The steps of FIG. 30 are described in detail below.

Figure 31:
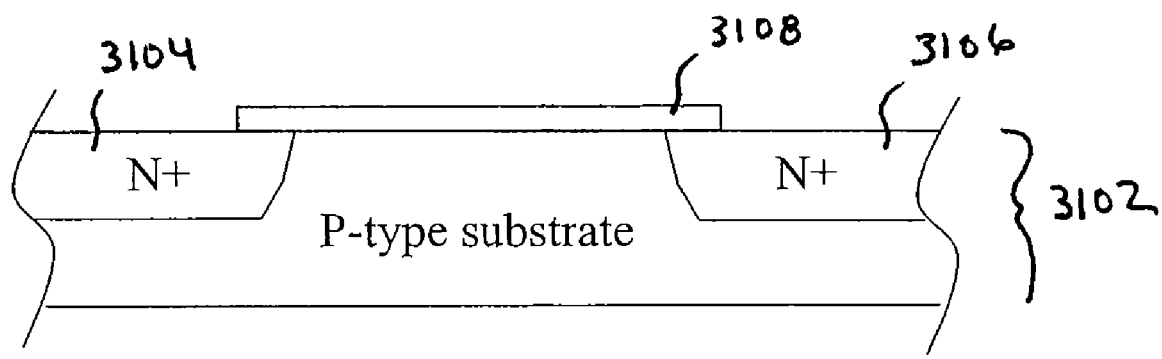
FIGS. 31-34 show various stages in the fabrication of an example floating gate memory device, according to embodiments of the present invention.

Flowchart 3000 begins with step 3002. In step 3002, a source region and a drain region are formed on a substrate. For example, FIG. 31 shows an example P-type substrate 3102. A source region 3104 and a drain region 3106 are formed therein, which are highly doped N-type regions (N+). Note that substrate 3102 can alternatively be an N-type substrate, and source and drain regions 3106 can be P-type regions. Any conventional doping technique may be used for step 3002.

In step 3004, a dielectric layer is formed on the substrate. For example, FIG. 31 shows an example dielectric layer 3108 formed on substrate 3102. Step 3004 is optional. Dielectric layer 3108 can be deposited in a localized manner, or a dielectric layer can be coated on substrate 3102 and subsequently patterned to cover the desired area of substrate 3102.

Figure 32:
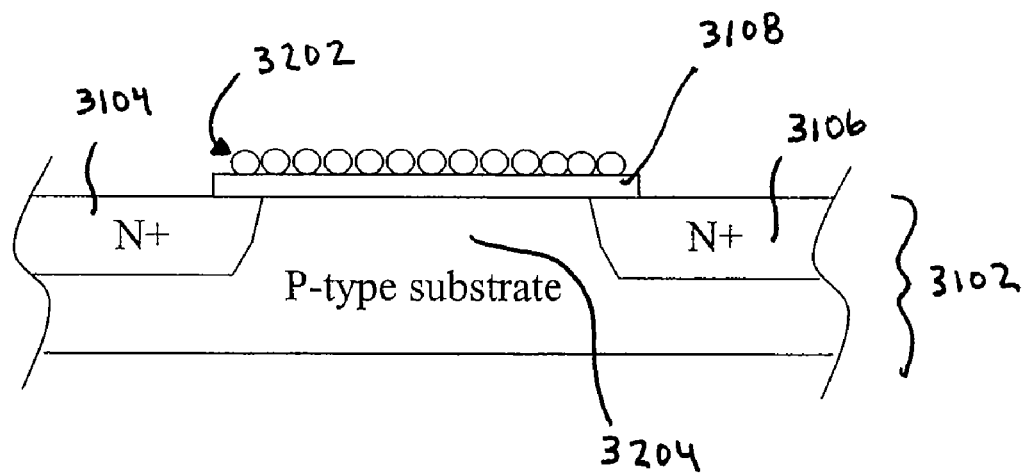

In step 3006, a thin film of nanoelements is formed on the substrate on/above a channel region. For example, FIG. 32 shows a thin film of nanoelements 3202 (similar to thin film of nanoelements 2010 described above) formed on dielectric layer 3108, adjacent to a channel region 3204 of substrate 3102. When dielectric layer 3108 is not present, thin film of nanoelements 3202 can be formed directly on substrate 3102. Step 3006 may include the deposition of a plurality of nanoparticles, nanorods, nanowires, other nanoelements, or any combination thereof, on the substrate in the channel region. Thin film of nanoelements 3202 can be deposited in a localized manner, or a thin film of nanowires can be coated on dielectric layer 3108/substrate 3102 and be subsequently patterned to cover the desired area.

Figure 33:
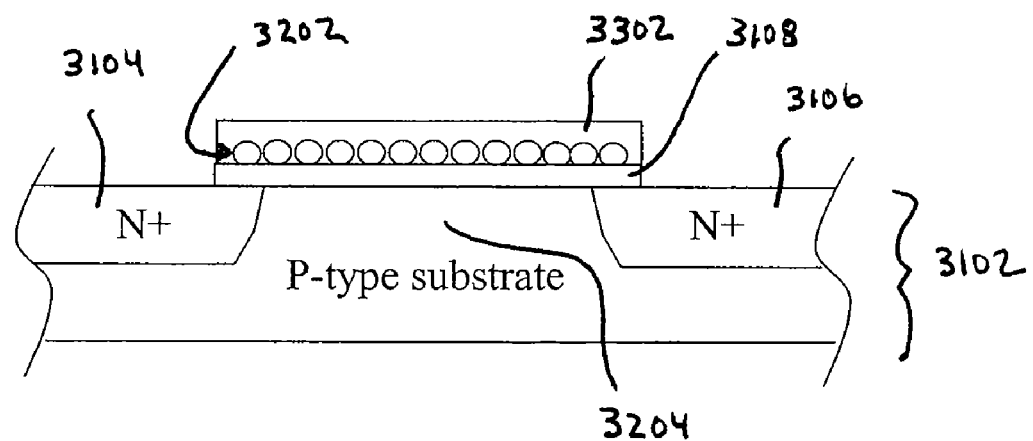

In step 3008, a dielectric layer is formed on the thin film of nanoelements. For example, FIG. 33 shows an example dielectric layer 3302 formed on substrate 3102. Step 3008 is optional. The dielectric layer can be deposited in a localized manner, or can be coated on thin film of nanoelements 3202/substrate 3102 and subsequently patterned to cover the desired area.

Figure 34:
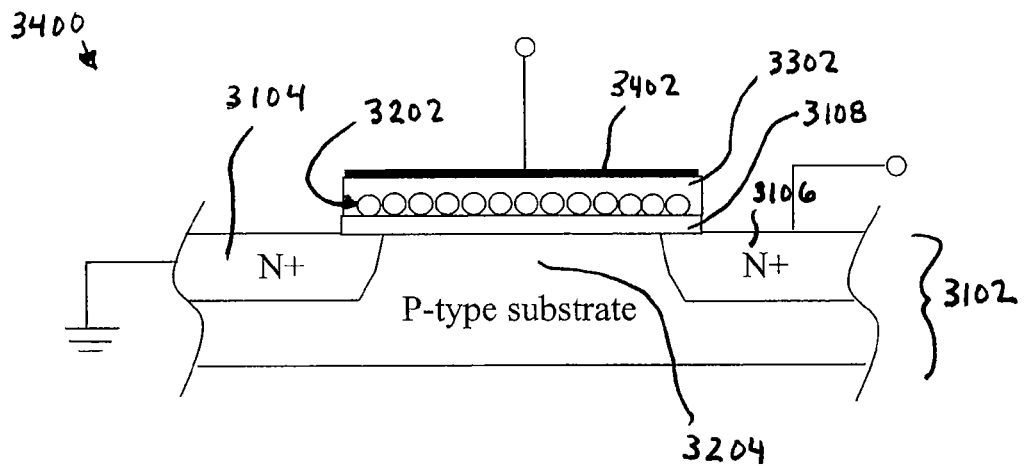

In step 3010, a gate contact is formed on the thin film of nanoelements. For example, FIG. 34 shows a gate contact 3402 formed on thin film of nanoelements 3202. Note that a source contact and a drain contact also can be formed during step 3010, or they can be formed at other times. Thus, as shown in FIG. 34, a memory device 3400 is formed, according to an embodiment of the present invention. Memory device 3400 is shown formed an N-type metal-oxide semiconductor device (NMOS), although it could alternatively be formed as a P-type metal-oxide semiconductor (PMOS) device.

Note that in an embodiment, flowchart 3000 can include a step where each nanoelement is formed as a single crystal nanoelement, is formed to have a core and shell structure, or is formed to have any other nanoelement structure type.

Figure 35:
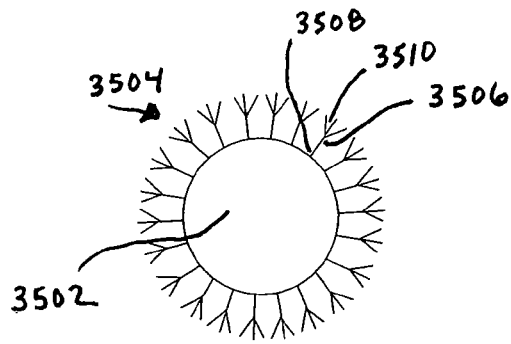
FIG. 35 shows an example nanoparticle that has been treated to incorporate a surface treatment, according to an embodiment of the present invention.

In another embodiment, flowchart 3000 can include a step where each nanoelement is treated. For example, FIG. 35 shows an example nanoparticle 3502 that has been treated to incorporate a surface treatment 3504, according to an embodiment of the present invention. For example, the surface treatment 3504 can include the formation of functional groups on, and/or the attachment of functional groups to the surface of nanoparticle 3502 (i.e., surface functional groups), as described, for example, in more detail in co-pending patent application U.S. Ser. No. 60/578,236 entitled "Post-Deposition Encapsulation of Nanocrystals: Compositions, Devices and Systems Incorporating Same," filed Jun. 8, 2004, the entire contents of which are incorporated by reference herein. In the example embodiment of FIG. 35, surface treatment 3504 includes a plurality of tails 3506 formed on nanoparticle 3502. Each tail 3506 has a first end 3508 (also known as a "head") and a second end 3510. First end 3508 is configured to be chemically attracted to nanoelements. Thus, when surface treatment 3504 is applied to nanoelements, first end 3508 of tails 3506 adhere to nanoelements, such as nanoparticle 3502. Second end 3510 is not configured to adhere to nanoelements, and thus extends away from the nanoelement to which first end 3508 is attached.

Nanoelements can be treated with tails 3506 in various ways, including being mixed in a solution with tails 3506, being sprayed with a solution including tails 3506, having tails 3506 grow directly on the nanoelements, etc. In an embodiment, tails 3506 of surface treatment 3504 are formed from polymers or organic materials, including carbon. Tails 3506 can be formed in any manner known to persons skilled in the relevant art(s).

Figure 36:
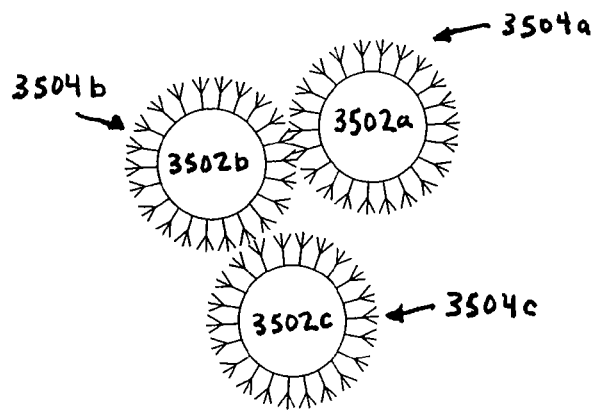
FIG. 36 shows a plurality of treated nanoparticles in a thin film of nanoelements, according to an embodiment of the present invention.

Surface treatment 3504 can be used to cause nanoelements to maintain a distance between each other, to reduce a likelihood of lateral charge transfer. For example, FIG. 36 shows a plurality of nanoparticles 3502a-c in a thin film of nanoelements. Each of nanoparticles 3502a-c has a respective surface treatment 3504a-c. As shown in FIG. 36, surface treatments 3504a and 3504b of nanoparticles 3502a and 3502b keep nanoparticles 3502a and 3502b apart at a distance approximately a length of two tails 3506 (i.e., a length of a tail attached to nanoparticle 3502a and a length of a tail attached to nanoparticle 3502b).

Furthermore, second end 3510 of tails 3506 can be configured to be liquid soluble. A surface treatment 3504 incorporating such tails 3506 can be formed on nanoelements to cause the nanoelements to be more easily dissolved in solution. The solution containing the dissolved nanoelements can then be applied to substrate 3102, for example, to form a thin film of nanoelements.

In using quantum dots for non-volatile memory transistors as the thin film of nanoelements, the inventors of the present application have discovered that the use of nanometer-sized colloidal metal nanoparticles (such as palladium (Pd), iridium (Ir), nickel (Ni), platinum (Pt), gold (Au), ruthenium (Ru), cobalt (Co), tungsten (W), tellurium (Te), iron platinum alloy (FePt), etc.) is attractive as compared to semiconductor materials because among other things these colloidal metal nanoparticles have a higher work function (e.g., about 4.5 eV or higher) than many semiconductors, which is better for multiple electron storage, higher melting point (which allows a higher thermal budget), longer retention times, and no surface states. For example, the novel synthesis of monodisperse colloidal metal nanoparticles (e.g., made from palladium, nickel, platinum etc.) and the related surfactant (or ligand) exchange reactions involved therein are described in commonly owned patent application, entitled "Process for Group 10 Metal Nanostructure Synthesis and Compositions Made Using Same," filed Dec. 16, 2004, the entire contents of which are incorporated by reference herein. However, one of the potential problems with the use of colloidal metal quantum dots such as palladium is the potential diffusion of metal atoms through the tunnel dielectric layer to the surface of the underlying silicon channel, where they might degrade device leakage current and other device parameters.

Figure 45:
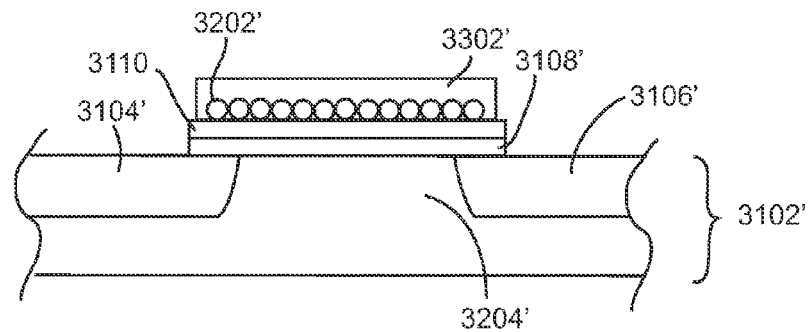
FIG. 45 shows a floating gate memory device according to an alternative embodiment of the invention which includes a metal migration barrier layer.

FIG. 45 illustrates one technique for altering the surface of the tunnel dielectric layer in order to provide an improved barrier to metal migration of metal quantum dots 3202' in which a metal migration barrier layer 3110 has been formed over the tunnel dielectric layer 3108'. The barrier layer may include, for example, a nitrogen containing compound such as nitride ($Si_3N_4$) or silicon oxynitride ($SiO_xN_y$), or other suitable barrier layer such as alumina ($Al_2O_3$). Such barrier layers change the surface structure of the tunnel dielectric such that metal migration effects may be minimized. Where the barrier layer is made from a nitrogen compound, the nitrogen-containing layer may be formed by nitriding the silicon dioxide tunneling dielectric layer, or by depositing on top of the silicon dioxide layer by chemical vapor deposition (CVD) processes such as low pressure CVD (LPCVD) or ultra high vacuum CVD (UHVCVD), and the nitrogen-containing layer may be in direct contact with the tunnel dielectric layer 3108'. UHVCVD of the barrier layer may be more controllable than LPCVD as the UHVCVD generally occurs more slowly and therefore the growth rate may be more closely regulated. The nitrogen-containing layer may be a result of deposition from the reaction of such gases as silane (or other silicon source precursor such as dichlorosilane, or disilane) and ammonia (or other nitrogen species such as plasma-ionized nitrogen, $N_2O$ or NO) or a surface reaction to a reacting gas such as ammonia (or other nitrogen species such as plasma-ionized nitrogen, $N_2O$ or NO). Dichlorosilane and ammonia gas in combination with a co-flow of some inert gas and oxygen-containing gas may be used for growth of the nitrogen-containing layer. Once a thin nitrogen-containing barrier layer 3110 has been formed on the surface of the tunnel dielectric layer 3108', penetration of nitrogen into the underlying tunnel dielectric layer 3108' will generally be impeded such that contamination of the tunnel dielectric layer 3108', which may result in leakage, is avoided.

The thickness of the barrier layer 3110 is preferably limited to ensure that carrier traps included in nitride structures do not dominate the charge storage aspects of the semiconductor device being formed. In one embodiment, a desired thickness for the barrier layer is less than 10 angstroms. In other embodiments, the desired thickness may be 5 angstroms or less. The relative thicknesses of the tunneling dielectric layer and the barrier layer can be tailored to optimize electrical performance and metal migration barrier functions. The thickness of the barrier layer should be at least that required to ensure generally uniform coverage of the tunnel dielectric layer 3108' by the barrier layer. In the case where silicon oxynitride is utilized as the barrier layer, the concentration of nitrogen within the silicon oxynitride may be greater than about 5%, for example. The percentage concentration of nitrogen included in the silicon oxynitride can be controlled such that the trade-off between the barrier function of the nitrogen layer against metal migration from the metal quantum dots and the inclusion of traps due to nitride concentration is regulated.

The thickness of the barrier layer 3110 is preferably limited to ensure that carrier traps included in nitride structures do not dominate the charge storage aspects of the semiconductor device being formed. In one embodiment, a desired thickness for the barrier layer is less than 10 angstroms. In other embodiments, the desired thickness may be 5 angstroms or less. The relative thicknesses of the tunneling dielectric layer and the barrier layer can be tailored to optimize electrical performance and metal migration barrier functions. The thickness of the barrier layer should be at least that required to ensure generally uniform coverage of the tunnel dielectric layer 3108' by the barrier layer. In the case where silicon oxynitride is utilized as the barrier layer, the concentration of nitrogen within the silicon oxynitride may be greater than about 5%, for example. The percentage concentration of nitrogen included in the silicon oxynitride can be controlled such that the trade-off between the barrier function of the nitrogen layer against metal migration from the metal quantum dots and the inclusion of traps due to nitride concentration is regulated.

To facilitate erasing from high work function colloidal metal dots, such as palladium metal dots, it may be beneficial to use high work function metals (e.g., metals having a work function greater than about 4.0 eV, e.g., greater than about 4.5 eV, e.g., greater than about 5.0 eV) or p+ polysilicon as the control gate material due to the small gate resistance of metal gates, desirable work function setting, and reduced electrical thickness of the gate dielectric. Several metal gate electrodes may be used such as W/TiN, Mo, Ta, TaN, TiN and TaSi$_x$N$_y$, for example. The metal gate should have a suitable work function and required thermal and chemical stability with the underlying thin control gate dielectric, especially for High-K dielectrics such as Al$_2$O$_3$, HfO$_2$, ZrO$_2$ and their silicates.

ii. Nano-enabled Multistate Memory Device Embodiments

Embodiments of the present invention are provided in this section for nano-enabled multistate memory devices. These embodiments are provided for illustrative purposes, and are not limiting. Additional operational and structural embodiments for the present invention will be apparent to persons skilled in the relevant art(s) from the description herein. These additional embodiments are within the scope and spirit of the present invention.

A memory device may have any number of memory cells. In a conventional single-bit memory cell, a memory cell assumes one of two information storage states, either an "on" state or an "off" state. The binary condition of "on" or "off" defines one bit of information. As a result, a conventional memory device capable of storing n-bits of data requires (n) separate memory cells.

The number of bits that can be stored using single-bit per cell memory devices depends upon the number of memory cells. Thus, increasing memory capacity requires larger die sizes containing more memory cells, or using improved photolithography techniques to create smaller memory cells. Smaller memory cells allow more memory cells to be placed within a given area of a single die.

An alternative to a single-bit memory cell is a multi-bit or multistate memory cell, which can store more than one bit of data. A multi-bit or multistate flash memory cell is produced by creating a memory cell with multiple, distinct threshold voltage levels, V$_{tl-n}$. Each distinct threshold voltage level, V$_{tl-n}$, corresponds to a value of a set of data bits, with the number of bits representing the amount of data that can be stored in the multistate memory cell. Thus, multiple bits of binary data can be stored within the same memory cell.

Each binary data value that can be stored in a multistate memory cell corresponds to a threshold voltage value or range of values over which the multistate memory cell conducts current. The multiple threshold voltage levels of a multistate memory cell are separated from each other by a sufficient amount so that a level of a multistate memory cell can be programmed or erased in an unambiguous manner. The specific relationship between the data programmed into the memory cell and the threshold voltage levels of the cell depends upon the data encoding scheme adopted for the multistate memory cell.

In programming a multistate memory cell, a programming voltage is applied over a sufficient time period to store enough charge in the floating gate to move the multistate memory cell's threshold voltage to a desired level. This level represents a state of the multistate memory cell, corresponding to an encoding of the data programmed into the multistate memory cell.

According to embodiments of the present invention, nanoelements are used to provide for multiple threshold voltage levels for a multistate memory cell/device. In an example embodiment of the present invention, a multistate memory cell has a floating gate that includes nanoelements (e.g., nanowires, nanorods, quantum-dots/nanoparticles, etc.). The nanoelements are formed to have a plurality of distinctive electron injection threshold voltages (trap depths).

Figure 37:
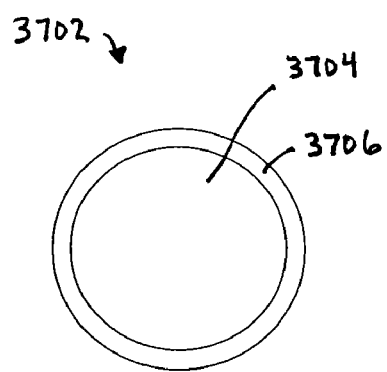
FIGS. 37-39 show cross-sectional views of various nanoelements with different shell thicknesses corresponding to different charge injection threshold voltages, according to example embodiments of the present invention.
Figure 38:
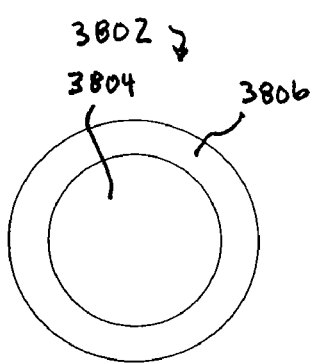
Figure 39:
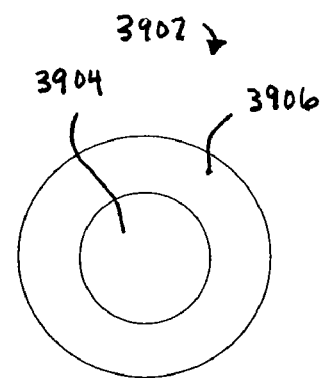

Nanoelements can be formed in various ways to have different electron injection threshold voltages. For example, in an embodiment, nanoelements can be formed to have a core/shell structure (such as described elsewhere herein), with different shell thicknesses corresponding to different threshold voltages. For example, FIGS. 37-39 show cross-sectional views of various nanoelements with different shell thicknesses, corresponding to different charge injection threshold voltages, according to example embodiments of the present invention. The different shell thicknesses shown in FIGS. 37-39 are shown for illustrative purposes, and do not necessarily represent actual shell thicknesses.

FIG. 37 shows a first nanoelement 3702 having a core 3704 and a shell 3706 surrounding core 3704. FIG. 38 shows a second nanoelement 3802 having a core 3804 and a shell 3806 surrounding core 3804. FIG. 39 shows a third nanoelement 3902 having a core 3904 and a shell 3906 surrounding core 3904. Shell 3706 has a first thickness 3708. Shell 3806 has a second thickness 3808. Shell 3906 has third thickness 3908. As shown in FIGS. 37-39, second thickness 3808 is greater than first thickness 3708, and third thickness 3908 is greater than second thickness 3808. Thus, second nanoelement 3802 requires a greater charging voltage than does first nanoelement 3702, in order to overcome the thickness of shell 3806. Third nanoelement 3902 requires a greater charging voltage than does second nanoelement 3802, in order to overcome the thickness of shell 3906. Different shell thicknesses can be used to provide multistate memory devices with different threshold voltages, for different data states.

Figure 40:
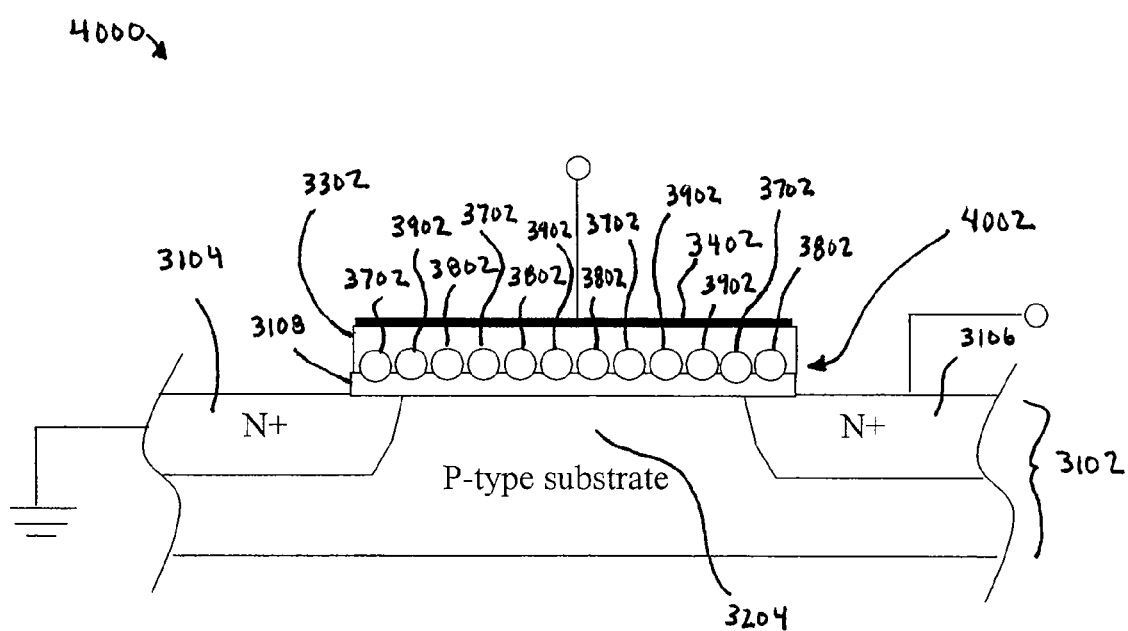
FIG. 40 shows an example multistate memory device, according to an embodiment of the present invention.

In embodiments, multistate memory devices can be fabricated similarly as described above for single state memory devices. For example, FIG. 40 shows an example multistate memory device 4000, according to an embodiment of the present invention. Multistate memory device 4000 is generally similar to memory device 3400 shown in FIG. 34. However, as shown in FIG. 40, multistate memory device 4000 includes a thin film of nanoelements 4002 that includes three types of nanoelements having a different charge injection threshold voltages. Multistate memory device 4000 is thus configured as a four-state memory cell (i.e., a two bit memory cell). Note that multistate memory devices having any number of states/bits can be created according to the present invention.

As shown in FIG. 40, thin film of nanoelements 4002 includes a mixture of nanoelement types, including a plurality of first nanoelements 3702, a plurality of second nanoelements 3802, and a plurality of third nanoelements 3902, in approximately equal portions. As described above, first, second, and third nanoelements 3702, 3802, and 3902 are each formed to establish a distinctive electron injection voltage value. For example, the respective injection voltage values are V1, V2 and V3, where V1<V2<V3.

Figure 41:
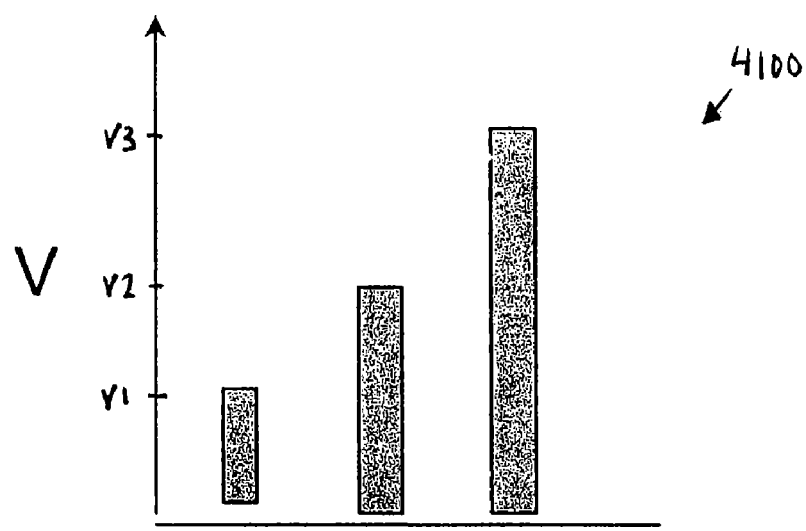
FIG. 41 shows a plot of input signal values applied to program the multistate memory device of FIG. 40, according to an example embodiment of the present invention.

The state of the multistate memory device 4000 depends on how thin film of nanoelements 4002 is charged. Thin film of nanoelements 4002 can be charged according to four states: State 1—no nanoelements are charged; State 2—one third of the nanoelements are charged (first nanoelements 3702); State 3—two thirds of the nanoelements are charged (first and second nanoelements 3702 and 3802); and State 4—all of the nanoelements are charged (first, second, and third nanoelements 3702, 3802, and 3902). FIG. 41 shows a plot 4100 of an input signal applied to gate contact 3402 to program multistate memory device 4000. The input signal must overcome the charge injection voltages V1, V2, and V3 to program multistate memory device 4000 to the three charged levels of States 2-4.

Figure 42:
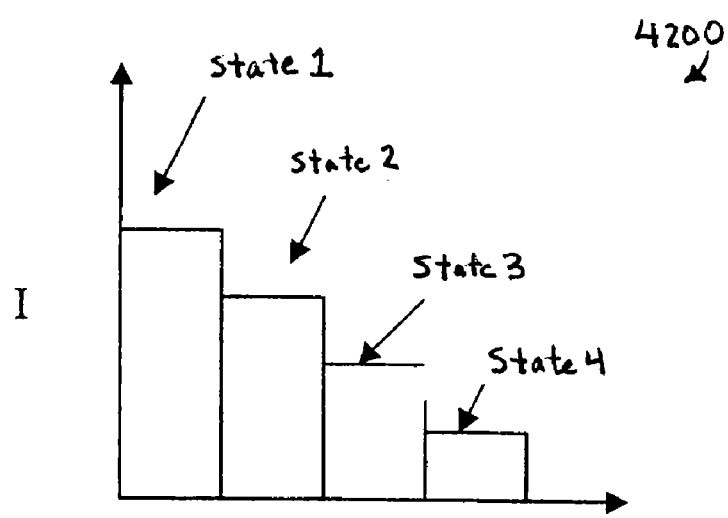
FIG. 42 shows a plot of currents measured through the multistate memory device of FIG. 40 when read in various states.

FIG. 42 shows a plot 4200 of currents measured through multistate memory device 4000 when it is read in various states. When multistate memory device 4000 is read, a largest current is measured when no particles are charged (State 1), and the measured current level drops for each of States 2-4. State 4 has the lowest current level, where all of nanoelements 3702, 3802, and 3804 are charged. Thus, multistate memory device 4000 exhibits four possible read states.

In another embodiment of the present invention, nanoelements are formed to have different electron injection threshold voltages to create a multistate memory cell. The multistate memory cell has a floating gate that includes nanoelements, such as quantum-dots, that are formed such that a "Coulomb blockade" effect can be exploited. Due to the Coulomb blockade, distinctive electron injection voltages (trap depths) are used to inject different number of electrons on each nanoelements. In a like manner as described above, this can be used to create multiple states.

A thermal fluctuation energy can be calculated as follows:

Thermal fluctuation energy=$k_b T$ where:
$k_b$=Boltzmann's constant=$1.38 \times 10^{-23}$ J/° K ($8.62 \times 10^{-5}$ eV/° K); and
T=operating temperature;
  wherein at room temperature, $k_b T = 4.144 \times 10^{-21}$ J (0.0259 eV).

The Coulomb charge energy for adding one extra electron into a nanoelement, such as a quantum dot, can be calculated as follows:

$E_c = e^2/C$ where:
C=the total capacitance of the nanoelement; and
e=charge of an electron.

If the Coulomb charge energy $E_c$ for adding one extra electron into a nanoelement, such as a quantum dot, is larger than the thermal fluctuation $k_b T$, a current that can flow into/through the nanoelement will dramatically depend on the number of electrons on the nanoelement. In this case, whenever an extra electron is added to an nanoelement having N electrons, the energy increases by the Coulomb charging energy ($E_c$) (plus the zero-dimensional level spacing if the discrete quantum energy is significant). This causes a blockade, known as Coulomb blockade, in current flow (or charge injection) into/through the nanoelement.

Figure 43:
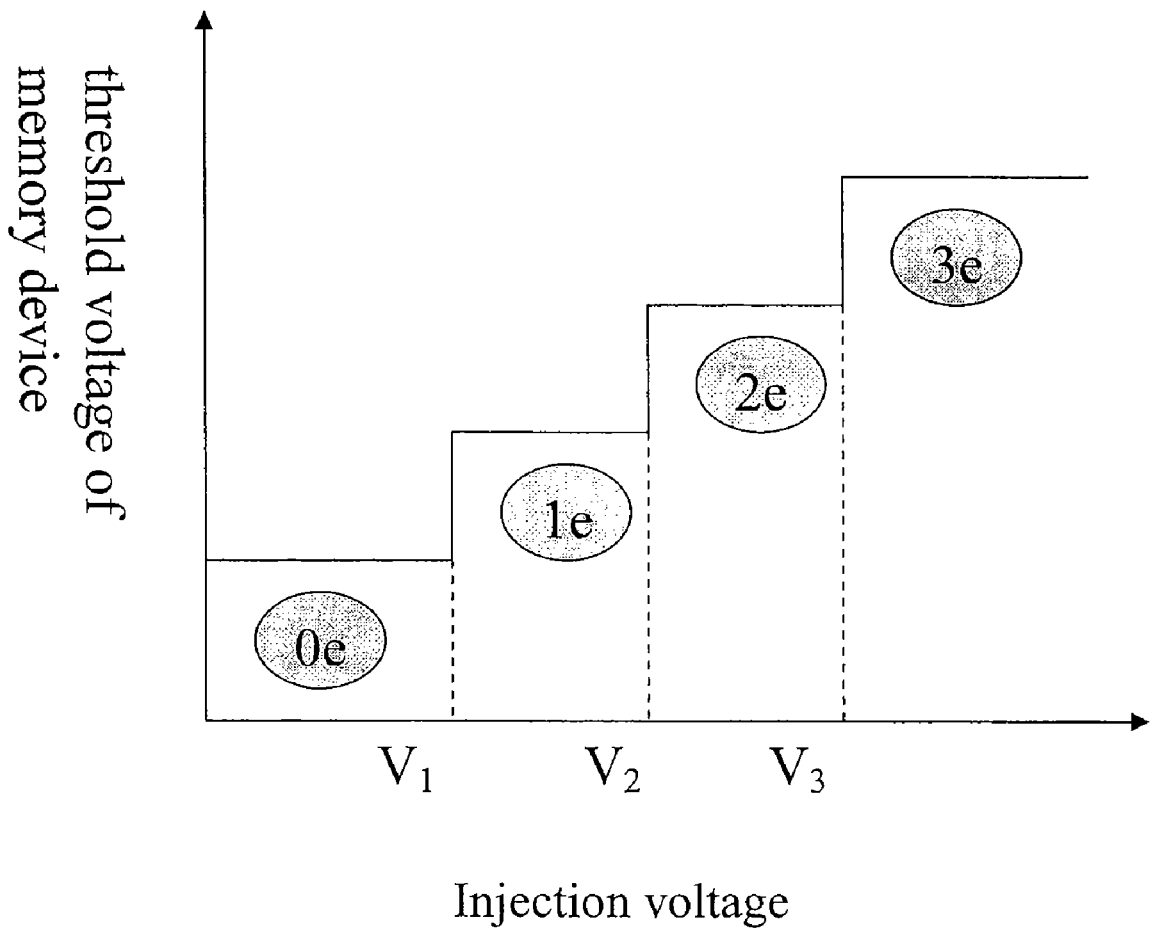
FIG. 43 shows a plot of threshold voltage versus charge injection for an example multistate memory device, according to an example embodiment of the present invention.

The Coulomb blockade effect can be exploited for multi-bit memory devices, in which distinctive electron injection voltages (trap depths) are required to inject different numbers of electrons on each nanoelement. For example, FIG. 43 shows a plot of threshold voltage versus charge injection for an example multistate memory device. As shown in FIG. 43, when a threshold voltage V0, V1, V2 or V3 is applied to the gate terminal of the multistate memory device, 0, 1, 2, or 3 electrons are respectively injected into the nanoelements. Thus, this corresponds to a multistate memory device having different charge states for different threshold voltages.

Such a multi-bit or multi-state memory device can also be realized by using nanoelements of different sizes, such that they have different corresponding capacitance values (e.g., C1>C2>C3). Each nanoelement therefore has a different charge energy (e.g., Ec1<Ec2<Ec3) and requires a respective distinctive injection voltage to inject electrons into them. For example, when a voltage V0 is applied, no electrons are injected to the nanoelements. When V1 is applied, electrons can only be injected into the largest nanoelement with smallest charge energy Ec1. When V2 is applied, electrons are injected into the next largest nanoelement with charge energy Ec2. By further increasing the injection voltage to V3, electrons are injected into the next largest nanoelement(s) with charge energy Ec3. Thus, a multi-bit memory device can be operated.

Figure 44:
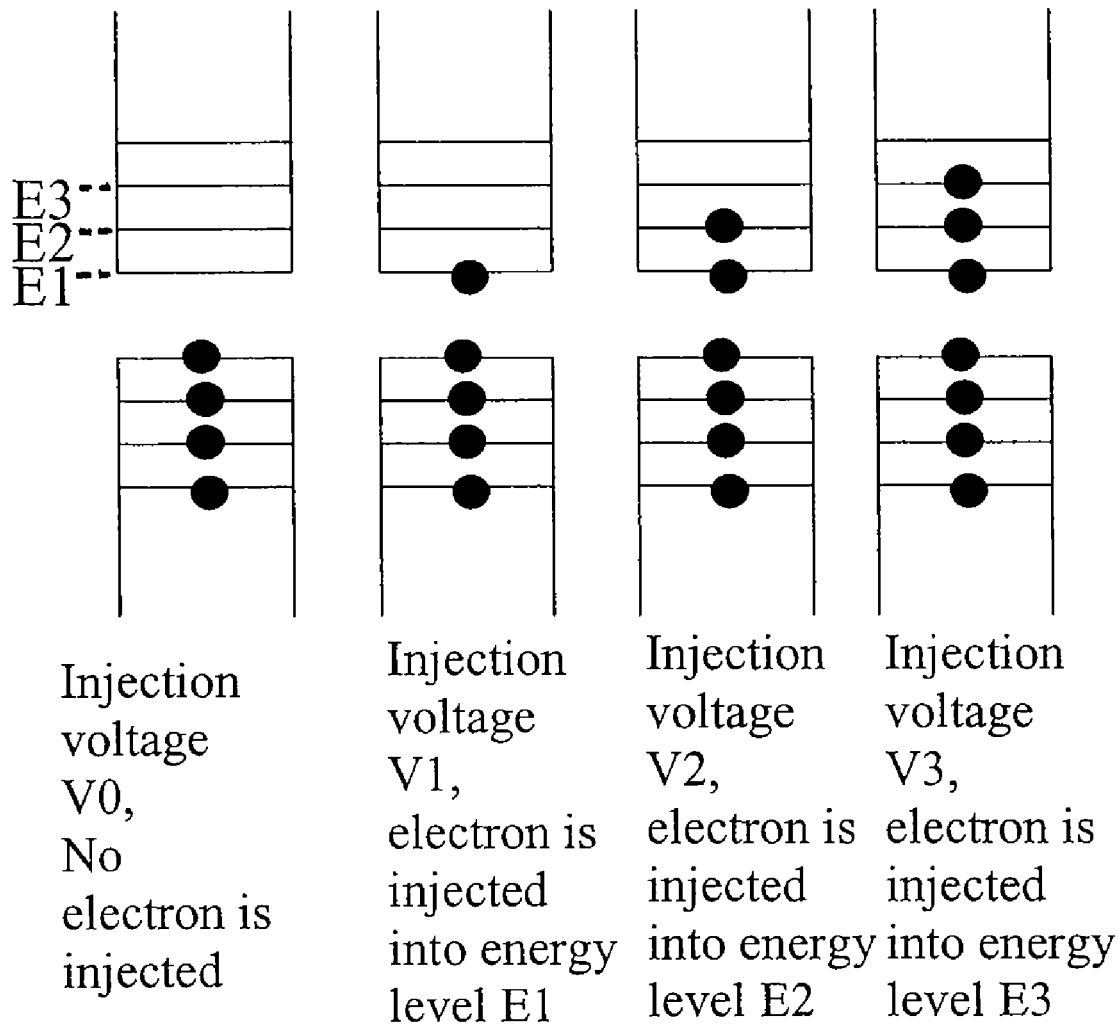
FIG. 44 shows an energy diagram showing discrete energy levels for a multi-bit memory, according to an example embodiment of the present invention.

Furthermore, when a nanoelement is small enough, such as a quantum dot, a quantum confinement effect can lead to discrete energy states (e.g., E1, E2 or E3). For example, FIG. 44 shows an energy diagram showing discrete energy levels for a multi-bit memory. In FIG. 44, the black dots represent filled states. As a result, distinctive injection voltages V1, V2, or V3 can be used to inject charges onto the discrete energy levels E1, E2 or E3, leading to multiple discrete charge states for a multi-bit memory. Note that in a nanoelement, the discrete energy states due to quantum confinement or charge energy can also be combined together to produce multiple charging states in a multi-bit (e.g., 2-bit) per cell memory device.

To create such a multi-bit per cell memory device discussed above, however, requires that the tunnel dielectric layer be very thin, which can result in limited retention times (e.g., premature tunneling of electrons from the floating gate to the channel). This is because, with programming voltages for practical write speeds, only for very thin tunnel barrier layers (e.g., less than about 1 nm), will the Fermi energy level of the channel traverse the discrete energy levels of the quantum dot, thus causing the tunneling of electrons onto the quantum dot one at a time. When the Fermi energy of the channel is lower than the next empty state on the quantum dot, the electrons are effectively "blocked" by the repulsive force of electron(s) already on the dot. It is only when the Fermi energy level of the channel goes above that of the next empty energy level of the quantum dot that an electron is allowed on the dot, thus providing control over the injection of electrons onto a quantum dot. This technique described above is called the Coulomb blockade effect.

To achieve multi-state memory with longer retention times, the tunnel dielectric layer needs to be thicker, e.g., on the order of about 3 to 5 nm or more. For such tunnel barriers of normal thickness, however, the Fermi energy of the channel is higher than that of all of the discrete energy levels of the quantum dot for programming voltages for practical writing speeds (e.g., which prevents separate charging of the discrete energy levels of the dot). In this case, a given injection voltage will cause electrons to tunnel to all of the discrete energy states of a given quantum dot at equilibrium, e.g., once the Fermi energy level of the channel is overcome. The tunneling rate, however, will depend on the number of electrons already on the dot. The more the electrons, of course, the slower the tunneling rate. The tunneling rate for different, discrete electron energy states can differ by a factor of about 1 to 10 (or more). It is possible to use this rate difference to control the number of electrons to put on the quantum dots, e.g., by controlling application of the injection voltage or programming time or their combination.

Figure 46A:
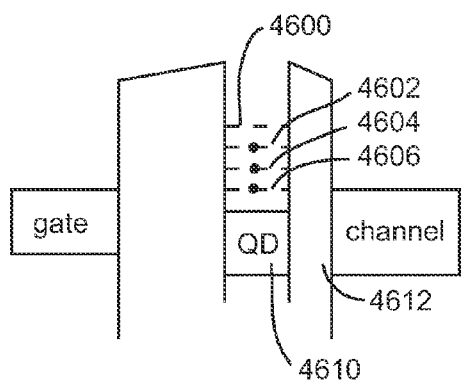
FIG. 46A shows an example multistate memory device according to an alternative embodiment of the invention.
Figure 46B:
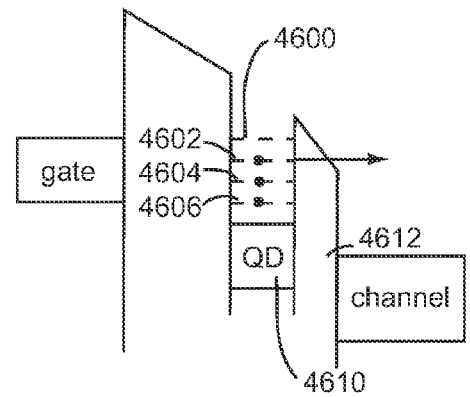
FIG. 46B shows the ejection of a single electron from the highest discrete energy level of the quantum dot of FIG. 46A.
Figure 46C:
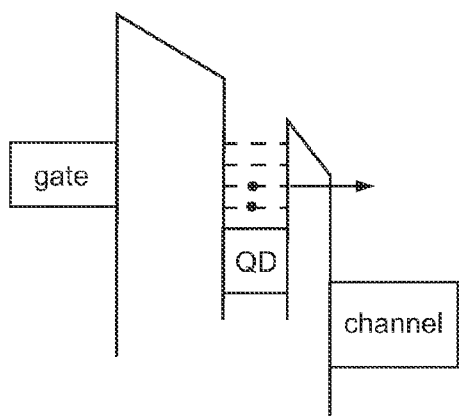
FIG. 46C shows the ejection of an electron from an intermediate discrete energy level of the quantum dot of FIG. 46A.
Figure 46D:
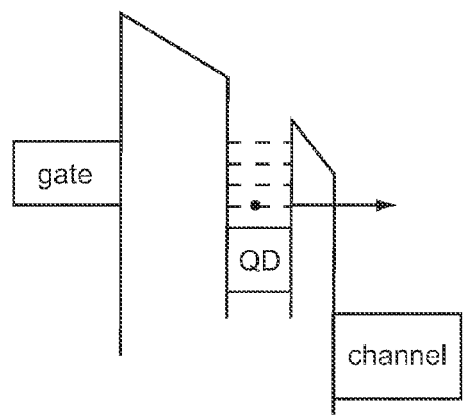
FIG. 46D shows the ejection of an electron from the lowest discrete energy level of the quantum dot of FIG. 46A.

Alternatively and notably, because each discrete energy level 4600-4606 of the quantum dot 4610 "sees" a different effective energy barrier 4612 as shown in FIGS. 46A-D, it is possible that the electrons (represented by solid dark circles in FIGS. 46A-D) which fill the discrete energy states 4602, 4604, and 4606 of the quantum dot 4610 can be taken out from the dot one at a time (as shown in FIGS. 46B-D) (e.g., by varying the applied voltage potential between the gate and channel regions) from each discrete energy level due to the energy barrier 4612 originated from the discrete energy level, thereby resulting in multi-state memory that allows accurate control of the number of electrons on the quantum dot during a programming operation. In other words, it is possible to program a memory device with a select number of electrons by filling at least a portion (or all) of the plurality of discrete energy levels of each dot or molecule with a plurality of electrons, and then removing individual electrons one at a time from one or more of the discrete energy levels until the desired number of electrons remain on the quantum dots or molecules. This novel method of programming (and/or discharging) a memory device can be applied to any structure that includes multiple discrete energy states including quantum dots with quantized energy levels (e.g., quantum dots made from semiconductor materials such as silicon), molecules with discrete molecular energy levels such as ferrocene, and a combination of other materials with different discrete energy levels such as platinum and tungsten.

Using the above principles, it is also possible to operate a single-bit or multi-bit memory device with a different average number of electrons to control the retention and erase time of the device, e.g., to get fast or slow erase and retention times as necessary. As noted above, in quantum dot memory increasing the thickness of the tunnel oxide increases the retention time for stored charge, but it also makes it harder to erase the stored charge, so there is a trade off between retention time and the speed of a write/erase cycle. For more archival memories a thick oxide could be made during manufacturing and these memories would require a long erase time. For archiving information a long erase time is not a problem because the memory is not frequently reused. For less archival memories, e.g., for memory in a digital camera, retention time doesn't have to be very long and the memory is reused frequently, so a thin oxide can be made for this application.

By controlling the average electron number (N) on a given quantum dot, the retention and erase time of the memory device can be varied in a controlled way during operation of the device without having to hard-wire the tunnel oxide thickness during manufacturing. In a colloidal metal-dot system, for example, because of the difference in work function between the channel region (typically Si) and the metal quantum dot (e.g., Pd which has a higher work function than Si), stored electrons cannot completely block the addition of more electrons to the same dot (e.g., because for normal tunnel oxide thicknesses, the Fermi energy of the channel is higher than that of all of the discrete energy levels of the quantum dot). The stored electrons do, however, have a substantial influence on the rate of removal of electrons from the dots during the erase cycle because electrons which are located in higher energy levels have a lower effective tunnel barrier height to tunnel through to the channel than those electrons which reside at lower energy levels.

With multiple (e.g., 5 to 10 or more) electrons on a dot, during erase the electron at the highest energy level is ejected quickly, and successive electrons are ejected progressively more slowly for a given erase voltage due to the increase in effective tunnel barrier height for electrons stored in increasingly lower energy levels. The inventors of the present application have discovered a method to operate a quantum dot memory device as a slow erase, long retention time memory or a fast erase, short retention time device using these principles. Because the addition and/or subtraction of a small number of electrons to/from the quantum dots can be controlled with near one-electron precision as described above, with an appropriately thick tunnel oxide (e.g., between about 3 to 5 nm, for example, about 4 nm), the memory device can be used as a long retention time, slow erase memory by storing a smaller number of electrons on each dot, e.g., between about 0 to 3 electrons per dot in a first state. In this state, the memory device can be operated in a write/read/erase cycle between the 0 to 3 electrons per dot (e.g., which can be the logic "1" state of the device for a single-bit device, or states "0", "1", "2" and "3" of a 2-bit memory device corresponding to 0, 1, 2 and 3 electrons on the dot, respectively). For a faster erase, shorter retention time device, the memory can be operated in a second state with a greater number of electrons, e.g., by programming each dot with between about between about 7 to 10 (or more) electrons per dot. The memory device in this state may then be operated in a write/read/erase cycle by controlling the number of electrons between 7 to 10 stored electrons per dot (e.g., which can be the logic "1" state of the device for a single-bit device, or with 7, 8, 9, and 10 electrons being the logic "0", "1", "2" and "3" states of the device, respectively, for a 2-bit memory device). The presence of absence of these varied charge states on the dots can be used to indicate a logic 1 or 0 for a single-state device (or multiple states for a multi-bit device), discovered by measuring the transistor output at a given gate voltage. It should be appreciated that because the number of stored electrons per dot/molecule may be dependent on the size of the quantum dot (or molecule) for particular quantum dot (or other molecular) structures, the memory device may be operated with a greater or smaller number of stored electrons in each of the respective states than those set forth herein in order to accomplish either a long retention time, slow erase device or a faster erase, shorter retention time device as described above.

Unlike other conventional types of multistate memory cells, including split gate cells and multi-gated three dimensional cells, the multistate memory device of the present invention does not require any additional communication lines to operate. Furthermore, any numbers of states are possible. In embodiments, thin film of nanoelements 4002 can include nanoelements manufactured from the same material, with different charged injection thresholds (e.g., due to the core-shell structure having different shell thickness, or having different sizes with corresponding capacitances, as described above), or can include nanoelements made from different materials, each with distinctive charge injection threshold levels. Multistate memory devices of the present invention can be manufactured as described above for single state memory devices. For example, they can be manufactured using a conventional CMOS manufacturing technique, inserting a coating/patterning step for the thin film of nanowires. The thin film of nanowires is deposited with the desired mixture of nanoelements having different charge injection threshold levels.

II. Applications of the Present Invention

Numerous electronic devices and systems can incorporate semiconductor or other type devices with thin films of nanoelements, according to embodiments of the present invention. Some example applications for the present invention are described below or elsewhere herein for illustrative purposes, and are not limiting. The applications described herein can include aligned or non-aligned thin films of nanowires, and can include composite or non-composite thin films of nanowires.

Semiconductor devices (or other type devices) of the present invention can be coupled to signals of other electronic circuits, and/or can be integrated with other electronic circuits. Semiconductor devices of the present invention can be formed in or on any substrate type, including an integrated circuit, a wafer, a small substrate, and a large substrate, which can be subsequently separated or diced into smaller substrates. Furthermore, on large substrates (i.e., substrates substantially larger than conventional semiconductor wafers), semiconductor devices formed thereon according to the present invention can be interconnected.

The present invention can be incorporated in applications requiring a single semiconductor device, and to multiple semiconductor devices. For example, the present invention is particularly applicable to large area, macro electronic substrates on which a plurality of semiconductor devices are formed. Such electronic devices can include display driving circuits for active matrix liquid crystal displays (LCDs), organic LED displays, field emission displays. Other active displays can be formed from a nanowire-polymer, quantum dots-polymer composite (the composite can function both as the emitter and active driving matrix). The present invention is also applicable to smart libraries, credit cards, large area array sensors, and radio-frequency identification (RFID) tags, including smart cards, smart inventory tags, and the like.

The present invention is also applicable to digital and analog circuit applications. In particular, the present invention is applicable to applications that require ultra large-scale integration on a large area substrate. For example, the thin film of nanowires embodiments of the present invention can be implemented in logic circuits, memory circuits, processors, amplifiers, and other digital and analog circuits.

Hence, a wide range of military and consumer goods can incorporate the thin film of nanowires embodiments of the present invention. For example, such goods can include personal computers, workstations, servers, networking devices, handheld electronic devices such as PDAs (personal digital assistants) and palm pilots, telephones (e.g., cellular and standard), radios, televisions, electronic games and game systems, home security systems, automobiles, aircraft, boats, other household and commercial appliances, and the like.

a. Thin Films/Matrixes of Nanoelements Embodiments

The present invention is directed to the use of nanoelements in systems and devices to improve system and device performance. For example, the present invention is directed to the use of nanoelements in semiconductor devices. According to the present invention, multiple nanoelements are formed into a high mobility thin film. The thin film of nanoelements is used in electronic devices to enhance the performance and manufacturability of the devices. Alternatively, multiple nanoelements are formed in a matrix or composite. This subsection describes some additional example thin films/matrixes of nanoelements that may be used in the present invention. In this subsection, nanowires are frequently referred to for illustrative purposes. However, it is to be understood that the present invention is directed to the use of any type of nanoelement, or combination of nanoelement types.

FIG. 1 shows a close-up view of a thin film of nanowires 100, according to an example embodiment of the present invention. Thin film of semiconductor nanowires 100 can be used in conventional electronic devices to achieve improved device behavior, while allowing for a straight forward and inexpensive manufacturing process.

As described above, nanoelements can be formed on substrates, such as semiconductor substrates. Furthermore, through the use of thin films of nanoelements, the present invention is particularly adapted to making high performance, low cost devices on flexible and non-flexible substrates.

As shown in FIG. 1, thin film of nanowires 100 includes a plurality of individual nanowires closely located together. Thin film of nanowires 100 can have a variety of thickness amounts that are equal to or greater than the thickness of a single nanowire. In the example of FIG. 1, the nanowires of thin film of nanowires 100 are aligned such that their long axes are substantially parallel to each other. Note that in alternative embodiments, the nanowires of thin film of nanowires 100 are not aligned, and instead can be oriented in different directions with respect to each other, either randomly or otherwise. In an alternative embodiment, the nanowires of thin film of nanowires 100 may be isotropically oriented, so that high mobility is provided in all directions. Note that the nanowires of thin film of nanowires 100 may be aligned in any manner relative to the direction of electron flow in order to enhance performance as required by a particular application.

In an embodiment, a matrix or thin film of nanowires 100 can be formed to have asymmetric mobility. For example, this can be accomplished by asymmetrically aligning the nanowires of thin film of nanowires 100, and/or by doping the nanowires in a particular manner. Such asymmetric mobility can be caused to be much greater in a first direction than in a second direction. For example, asymmetric mobilities can be created in the order of 10, 100, 1000, and 10000 times greater in the first direction than in the second direction, or to have any other asymmetric mobility ratio between, greater, or less than these values.

The nanowires of thin film of nanowires 100 can be doped in various ways to improve performance. The nanowires can be doped prior to inclusion in a device, or after inclusion. Furthermore, a nanowire can be doped differently along portions of its long axis, and can be doped differently from other nanowires in thin film of nanowires 100. Some examples of doping schemes for individual nanowires, and for thin films/matrixes of nanowires are provided as follows. However, it will be apparent to persons skilled in the relevant art(s) from the teachings herein that nanowires, and thin films and/or matrixes thereof, can be doped according to additional ways, and in any combination of the ways described herein.

Figure 2:
FIGS. 2-6 shows nanowires doped/coated according to various example embodiments of the present invention.

FIG. 2 shows a nanowire 200 that is a uniformly doped single crystal nanowire. Such single crystal nanowires can be doped into either p- or n-type semiconductors in a fairly controlled way. Doped nanowires such as nanowire 200 exhibit improved electronic properties. For instance, such nanowires can be doped to have carrier mobility levels comparable to alternative single crystal materials. In addition, and without being bound to any particular theory of operation, due to a one-dimensional nature of the electron-wave traversing inside the nanowire channel, and a reduced scattering probability, it may be possible for such nanowires to achieve even higher mobility than a bulk single crystal material. Carrier mobility levels up to 1500 $cm^2/V \cdot s$ have been shown for single p-type Si (silicon) nanowires, and carrier mobility levels up to 4000 $cm^2/V \cdot s$ have been shown for n-type InP nanowires.

Figure 3:
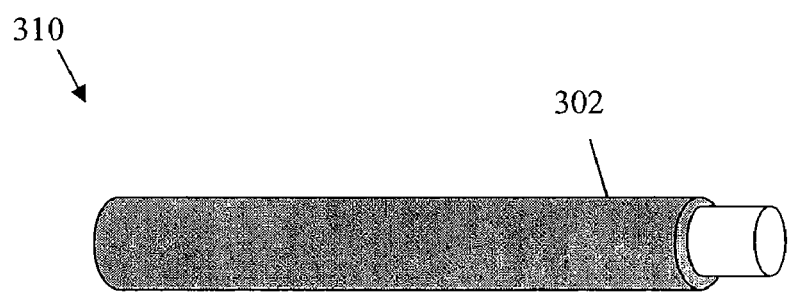

FIG. 3 shows a nanowire 310 doped according to a core-shell structure. As shown in FIG. 3, nanowire 310 has a doped surface layer 302, which can have varying thickness levels, including being only a molecular monolayer on the surface of nanowire 310. Such surface doping can separate impurities from a conducting channel of the nanowire, and suppress an impurity-related scattering event, and thus may lead to greatly enhanced carrier mobility. For example, when nanowires are doped according to the core-shell structure, "ballistic" transport may be achieved inside the nanowires. "Ballistic" transport is where electrical carriers are transported through a nanowire with essentially no resistance. Further detail on doping of nanowires is provided below.

Figure 4:

FIG. 4 shows a nanowire 420 that is uniformly doped, and coated with a dielectric material layer 404, according to another type of core-shell structure. Dielectric material layer 404 can be chosen from a variety of dielectric materials, such as $SiO_2$ or $Si_3N_4$. The use of dielectric material layer 404 can simplify fabrication of semiconductor device 200, as described elsewhere herein. Dielectric material layer 404 can be formed on nanowire 420, as is further described below.

Figure 5:
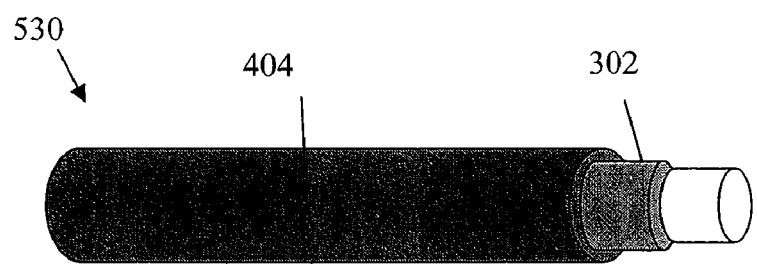

FIG. 5 shows a nanowire 530 that is doped with a doped surface layer 302 according to the core-shell structure shown in FIG. 3, and is also coated with a dielectric material layer 404, as shown in FIG. 4.

Figure 6:
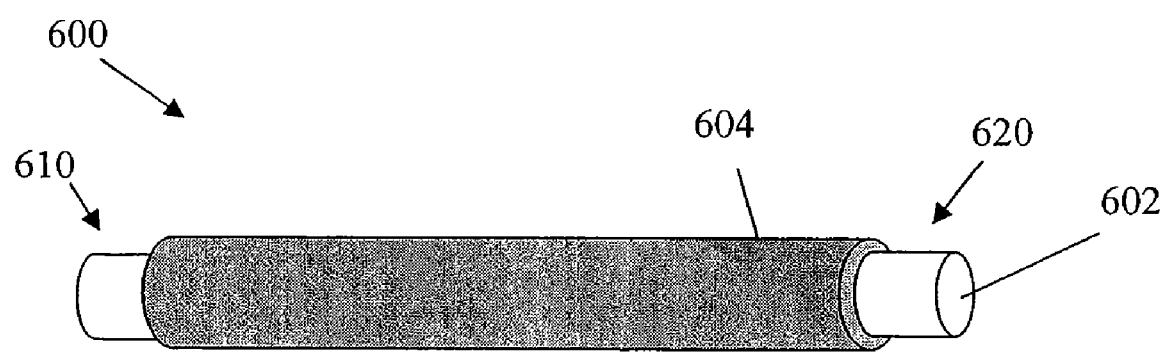

Note that a shell can be formed to surround a nanowire, leaving ends of the nanowire exposed. Alternatively, a shell can be formed to completely cover the nanowire, and the shell covering the ends of the nanowire can be removed (e.g., by lithography and etching, etc.) to expose the ends. This is useful when the shell is insulating (e.g., dielectric material layer 404) for example, and it is desired to make electrical contact with the conducting core of the nanowire using the exposed ends. For example, FIG. 6 shows a nanowire 600 having a core-shell structure, with first and second ends 610 and 620 of a core 602 having portions that are not covered by a shell 604.

Collections of nanowires manufactured with these materials are useful building blocks for high performance electronics. A collection of nanowires orientated in substantially the same direction will have a high mobility value. Furthermore, nanowires can be flexibly processed in solution to allow for inexpensive manufacture. Collections of nanowires can be easily assembled onto any type of substrate from solution to achieve a thin film of nanowires.

Note that nanowires can also be used to make high performance composite materials when combined with polymers/materials such as organic semiconductor materials, which can be flexibly spin-cast on any type of substrate. Nanowire/polymer composites can provide properties superior to a pure polymer materials.

As described above, collections or thin films of nanowires can be aligned into being substantially parallel to each other, or can be left non-aligned or random. Non-aligned collections or thin films of nanowires provide electronic properties comparable or superior to polysilicon materials, which typically have mobility values in the range of 1-10 $cm^2/V \cdot s$.

Aligned collections or thin films of nanowires provide materials having performance comparable or superior to single crystal materials. Furthermore, collections or thin films of nanowires that include aligned ballistic nanowires (e.g., core-shell nanowires as shown in FIG. 3) can provide dramatically improved performance over single crystal materials.

Aligned and non-aligned, and composite and non-composite thin films of nanowires can be produced in a variety of ways, according to the present invention. Example embodiments for the assembly and production of these types of thin films of nanowires are provided as follows.

Randomly oriented thin films of nanowires can be obtained in a variety of ways. For example, nanowires can be dispersed into a suitable solution. The nanowires can then be deposited onto a desired substrate using spin-casting, drop-and-dry, flood-and-dry, or dip-and-dry approaches. These processes can be undertaken multiple times to ensure a high degree of coverage. Randomly oriented thin films of nanowires/polymer composites can be produced in a similar way, providing that the solution in which the nanowires are dispersed is a polymer solution.

Aligned thin films of nanowires can be obtained in a variety of ways. For example, aligned thin films of nanowires can be produced by using the following techniques: (a) Langmuir-Blodgett film alignment; (b) fluidic flow approaches, such as described in U.S. Ser. No. 10/239,000, filed Sep. 10, 2002, and incorporated herein by reference in its entirety; and (c) application of mechanical shear force. For example, mechanical shear force can be used by placing the nanowires between first and second surfaces, and then moving the first and second surfaces in opposite directions to align the nanowires. Aligned thin films of nanowires/polymer composites can be obtained using these techniques, followed by a spin-casting of the desired polymer onto the created thin film of nanowires. For example, nanowires may be deposited in a liquid polymer solution, alignment can then be performed according to one of these or other alignment processes, and the aligned nanowires can then be cured (e.g., UV cured, crosslinked, etc.). An aligned thin film of nanowires/polymer composite can also be obtained by mechanically stretching a randomly oriented thin film of nanowires/polymer composite.

A dielectric layer can be formed on the nanowires, such as dielectric material layer 404, as shown in FIG. 4. The dielectric layer can be formed by oxidizing the nanowires, or otherwise forming the dielectric layer. For example, other non-oxided high dielectric constant materials can be used, including silicon nitride, $Ta_2O_5$, $TiO_2$, $ZrO_2$, $HfO_2$, $Al_2O_3$, and others. Nitridation of nanowires can be accomplished with processes similar to those employed in oxidation of nanowires. These materials can be applied to nanowires by chemical vapor deposition (CVD), solution phase overcoating, or simply by spin-coating the appropriate precursor onto the substrate. Other known techniques can be employed.

Note that in some embodiments, more than one layer of a thin film of nanoelements can be applied to a substrate in a given area. The multiple layers can allow for greater electrical conductivity, and can be used to modify electrical characteristics of a respective semiconductor device. The multiple layers can be similar, or different from each other. For example, two or more layers of thin films of nanowires having nanowires aligned in different directions, doped differently, and/or differently insulated, can be used in a particular semiconductor device. A contact area of a particular semiconductor device can be coupled to any one or more of the layers of a multiple layer thin film of nanowires. Note that a thin film of nanowires can be formed as a monolayer of nanowires, a sub-monolayer of nanowires, and greater than a monolayer of nanowires, as desired.

III. CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A memory device, comprising:
    a substrate;
    a source region of said substrate;
    a drain region of said substrate;
    a channel region between said source and drain regions;
    a charge storage region above said channel region including a population of nanoelements which are deposited in said charge storage region after they are grown, said nanoelements comprising a core made from ruthenium or iridium and a shell layer that surrounds said core which shell layer is an oxidized layer of each of said nanoelement;
    a dielectric layer deposited between said substrate and said charge storage region; and
    a gate contact formed above or below said population of nanoelements.

2. The memory device of claim 1, wherein the nanoelements comprise substantially spherical nanoelements or quantum dots.

3. The memory device of claim 1, wherein the nanoelements comprise ruthenium.

4. The memory device of claim 1, further comprising a nitride layer deposited or formed on said dielectric layer adjacent to said charge storage region.

5. The memory device of claim 4, wherein the nitride layer comprises silicon nitride.

* * * * *

UNITED STATES PATENT AND TRADEMARK OFFICE
CERTIFICATE OF CORRECTION

PATENT NO. : 7,382,017 B2 Page 1 of 1
APPLICATION NO. : 11/695728
DATED : June 3, 2008
INVENTOR(S) : Duan et al.

It is certified that error appears in the above-identified patent and that said Letters Patent is hereby corrected as shown below:

On the title page Item (75), please delete "Calvin Y.H. Cho" and insert --Calvin Y.H. Chow--.

Signed and Sealed this

Twenty-third Day of December, 2008

JON W. DUDAS
*Director of the United States Patent and Trademark Office*